(12) United States Patent
Yeo et al.

(10) Patent No.: US 10,659,021 B2
(45) Date of Patent: May 19, 2020

(54) VECTOR SUM CIRCUIT AND PHASE CONTROLLER USING THE SAME

(71) Applicants:Samsung Electronics Co., Ltd., Suwon-si, Gyeonggi-do (KR); Korea Advanced Institute of Science and Technology, Daejeon (KR)

(72) Inventors: Sungku Yeo, Suwon-si (KR); Gwanghyeon Jeong, Daejeon (KR); Songcheol Hong, Daejeon (KR); Jaeseok Park, Suwon-si (KR); Seunghun Wang, Daejeon (KR); Youngho Ryu, Suwon-si (KR); Junhan Lim, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/248,159

(22) Filed: Jan. 15, 2019

(65) Prior Publication Data

US 2019/0222205 A1 Jul. 18, 2019

(30) Foreign Application Priority Data

Jan. 15, 2018 (KR) .................. 10-2018-0005000

(51) Int. Cl.
| | | |
|---|---|---|
| *H03K 3/00* | (2006.01) | |
| *H03K 5/00* | (2006.01) | |
| *H03H 11/32* | (2006.01) | |
| *H03K 17/687* | (2006.01) | |
| *H03M 1/66* | (2006.01) | |
| *H02J 50/10* | (2016.01) | |
| *H03M 1/74* | (2006.01) | |

(52) U.S. Cl.
CPC ............... *H03K 5/00* (2013.01); *H03H 11/32* (2013.01); *H03K 17/687* (2013.01); *H03M 1/66* (2013.01); *H02J 50/10* (2016.02); *H03K 2005/00286* (2013.01); *H03M 1/742* (2013.01)

(58) Field of Classification Search
CPC .... H03D 7/165; H03D 7/1441; H03D 7/1458; H04B 1/30; H04B 1/28
See application file for complete search history.

(56) References Cited

U.S. PATENT DOCUMENTS

| | | | |
|---|---|---|---|
| 2005/0024113 A1* | 2/2005 | Kartschoke | .......... H03K 3/0375 327/215 |
| 2013/0242621 A1 | 9/2013 | Hussain et al. | |
| 2018/0145660 A1* | 5/2018 | Qian | ...................... H03H 11/20 |

FOREIGN PATENT DOCUMENTS

| | | |
|---|---|---|
| KR | 10-2014-0139560 A | 12/2014 |
| KR | 10-1721866 B1 | 4/2017 |
| KR | 10-1772206 B1 | 8/2017 |

* cited by examiner

Primary Examiner — Sibin Chen
(74) Attorney, Agent, or Firm — Jefferson IP Law, LLP

(57) ABSTRACT

A vector sum circuit and a phase controller including the vector sum circuit are provided. The vector sum circuit includes an amplifier configured to amplify an input orthogonal signal by using a first metal oxide semiconductor field effect transistor (MOSFET), and a self body-biasing circuit comprising a resistor. The self body-biasing circuit is configured to connect a drain and a body of the first MOSFET to reduce a voltage connected to the body as a current at the drain increases.

7 Claims, 18 Drawing Sheets

US 10,659,021 B2

VECTOR SUM CIRCUIT AND PHASE CONTROLLER USING THE SAME

CROSS-REFERENCE TO RELATED APPLICATION(S)

This application is based on and claims priority under 35 U.S.C. § 119 of a Korean patent application number 10-2018-0005000 filed on Jan. 15, 2018 in the Korean Intellectual Property Office, the disclosure of which is incorporated by reference herein in its entirety.

BACKGROUND

1. Field

The disclosure relates to a phase controller using a vector sum circuit. More particularly, the disclosure relates to a phase controller using a vector sum circuit, which is capable of independently controlling phase and amplitude and is implementable in a small size when compared to an existing type, a semiconductor chip including the phase controller, and a control method of the phase controller.

2. Description of Related Art

In the field of wireless power transmission technology for wirelessly delivering electric energy to a receiver, a method for transmitting electric energy from an electric motor or transformer using an electromagnetic induction principle by using electromagnetic waves, such as radio waves or lasers, has been developed. Meanwhile, it is known that when a radio frequency (RF) system based on beamforming is applied, energy transmission efficiency may be enhanced in the field of wireless power transmission.

When digital beamforming technology applied to an existing artificial satellite or ladar system is employed in a phased array system including multiple antennas, the complexity of the phased array system is increased. Thus, an analog phased array beamforming system may be used in which a phased array is formed in an RF stage using a phase shifter. The analog phased array beamforming system generates a beam through the phased array to form the same phase difference between RF paths, compensates for an RF path-specific gain error through gain control, and assigns a proper gain weight in order to reduce a side lobe component.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a phase controller capable of independently controlling a phase and a control method of the phase controller.

Another aspect of the disclosure also is to provide a phase controller that is favorable to miniaturization while providing a high phase control resolution, and a semiconductor chip including the phase controller.

Another aspect of the disclosure also is to provide a phase controller which enhances the transmission efficiency of a wireless power transmission system and has an extended power transmission distance, as well as a control method of the phase controller.

Additional aspects will be set forth in part in the description which follows and, in part, will be apparent from the description, or may be learned by practice of the presented embodiments.

In accordance with an aspect of the disclosure, a vector sum circuit is provided. The vector sum circuit may include an amplifier configured to amplify an input orthogonal signal by using a first metal oxide semiconductor field effect transistor (MOSFET) and a self body-biasing circuit including a resistor. The self-biasing body-biasing circuit may be configured to connect a drain and the body of the first MOSFET to reduce the voltage applied to the body as a current at the drain increases.

In accordance with an aspect of the disclosure, the vector sum circuit may further include an amplification controller configured to control a tail current of the amplifier, and determine whether to enable the amplifier based on a phase difference to be controlled for the orthogonal signal.

In accordance with an aspect of the disclosure, the amplification controller may include a second MOSFET connected to the source of the first MOSFET and configured to control the tail current of the amplifier, and a switch configured to provide an output of a current mirror circuit interlocked with an output of a digital-to-analog converter (DAC) to a gate of the second MOSFET.

In accordance with an aspect of the disclosure, the first MOSFET may receive the orthogonal signal through a gate thereof, and a drain of the second MOSFET may be connected to the source of the first MOSFET.

In accordance with an aspect of the disclosure, the amplifier may include a first amplifier and a second amplifier, and the amplification controller is further configured to control rates of a first tail current of the first amplifier and a second tail current of a second amplifier while maintaining the sum of the first tail current and the second tail current constant.

In accordance with an aspect of the disclosure, the orthogonal signal may include an I+ signal, a Q+ signal, an I− signal, and a Q− signal. The amplifier may include a first amplifier and a third amplifier into which the I+ signal and the I− signal are input, respectively, and a second amplifier and a fourth amplifier into which the Q+ signal and the Q− signal are input, respectively. The outputs of the first amplifier and the third amplifier may be connected inversely with respect to each other, and outputs of the second amplifier and the fourth amplifier may be connected inversely with respect to each other.

In accordance with an aspect of the disclosure, the first amplifier and the third amplifier may respectively include the first MOSFET into which the I+ signal is input and a third MOSFET into which the I− signal is input, respectively. The second amplifier and the fourth amplifier may respectively include a fourth MOSFET into which the Q+ signal is input and a fifth MOSFET into which the Q− signal is input. The first MOSFET and the third MOSFET may be connected with a second MOSFET connected to a first output node of the current mirror circuit, and the fourth MOSFET and the fifth MOSFET may be connected to a sixth MOSFET connected to a second output node of the current mirror circuit.

In accordance with another aspect of the disclosure, a phase controller may include an input balun configured to convert a single-phase input signal into a differential input signal, an orthogonal signal generator configured to receive the differential input signal and output an orthogonal signal, an orthogonal signal amplifier configured to amplify the orthogonal signal by using a first metal oxide semiconductor field effect transistor (MOSFET) in which the voltage applied to a body decreases as current at a drain increases, a digital-to-analog converter (DAC) configured to control a gain of the orthogonal signal amplifier, a differential combiner configured to output a differential output signal by using the amplified orthogonal signal, and an output balun configured to convert the differential output signal into a single-phase output signal.

In accordance with another aspect of the disclosure, the DAC may include a current mirror circuit configured to divide the current of the DAC into a first current and a second current based on a gain, and the orthogonal signal amplifier may amplify the orthogonal signal based on a gain determined by the first current and the second current.

In accordance with another aspect of the disclosure, the orthogonal signal may include the I signal and the Q signal, and the orthogonal signal amplifier may be further configured to amplify the I signal based on the first current and the Q signal based on the second current.

In accordance with another aspect of the disclosure, the orthogonal signal amplifier may include a second MOSFET connected to the first MOSFET. The orthogonal signal amplifier may be further configured to control the drain current of the first MOSFET, and a gate of the second MOSFET may be connected to the current mirror circuit.

In accordance with another aspect of the disclosure, the current mirror circuit may include a first MOSFET group and a second MOSFET group to which the current of the DAC is separately applied by an operation of a switch connected to a gate of the first MOSFET group and an operation of a switch connected to a gate of the second MOSFET group, and a third MOSFET connected at a drain thereof to the first MOSFET group and connected at a gate thereof to a gate of the second MOSFET group.

In accordance with another aspect of the disclosure, a body and a drain of the first MOSFET group may be connected through a resistor.

In accordance with another aspect of the disclosure, the DAC may be further configured to determine the rates of the first current and the second current based on a phase control value for the single-phase input signal.

In accordance with another aspect in the disclosure, a semiconductor chip may include a plurality of signal processing modules, wherein each of the plurality of signal processing modules includes a phase controller configured to output a single-phase output signal having a phase modulated from a single-phase input signal by using a vector sum circuit and includes a first MOSFET, in which a voltage applied to a body decreases as current at a drain increases, a DAC configured to control a gain of the first MOSFET, and a power distributor configured to distribute power input through a power input node to the phase controller.

In accordance with another aspect in the disclosure, the power distributor connects the power input node to the plurality of signal processing modules.

The phase controller may include at least one resistor connected to a drain and a body of the first MOSFET.

The power distributor may include a capacitor connected between the ground part and the power input node, a plurality of capacitors connected between the ground part and each of the signal processing modules, respectively, a plurality of inductors connected between the power input node and each of the plurality of signal processing modules, respectively.

The DAC may include a plurality of DACs configured to control each of the plurality of signal processing modules, respectively.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain various embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Unless defined otherwise, all terms (including technical and scientific terms) used herein may be used as meanings commonly understood by those of ordinary skill in the art. Terms used herein are intended to describe embodiments and are not intended to limit the disclosure. Herein, a singular form includes a plural form unless specially mentioned in phrases. Terms defined in this document are used for only describing a specific embodiment and may not have an intention to limit the scope of other embodiments.

In the disclosure, an expression such as "having, " "may have," "comprising," or "may comprise" indicates existence of a corresponding characteristic, e.g., a numerical value, a function, an operation, or an element like a part, and does not exclude existence of additional characteristic.

When it is mentioned that a component is "(functionally, electrically, or communicatively) coupled to" or "connected to" another component, it should be understood as including a case where the component is connected to another component through a third component as well as a case where the component is directly connected to the other component.

Hereinafter, some embodiments of the disclosure will be described with reference to the accompanying drawings.

Figure 1:
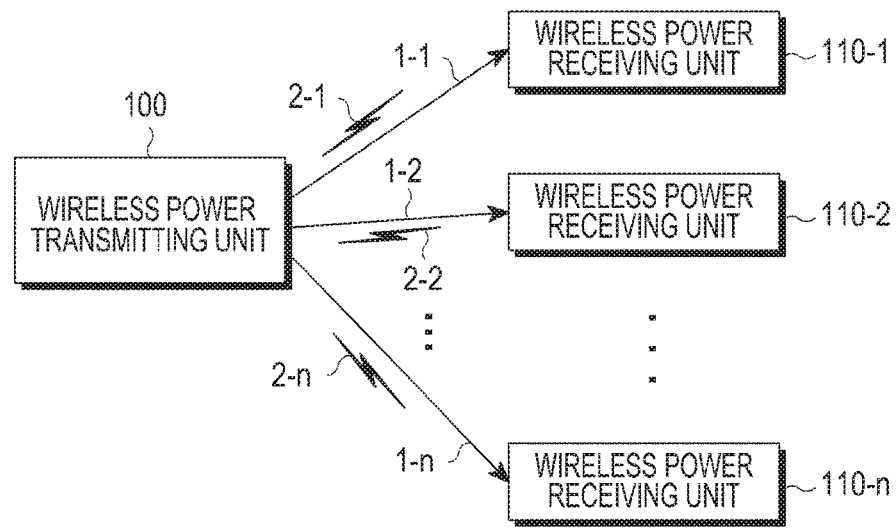
FIG. 1 is a conceptual view for describing an operation of a wireless charging system of the disclosure.

FIG. 1 is a conceptual diagram for describing an operation of a wireless charging system of the disclosure.

A wireless power receiver according to an embodiment disclosed herein may include various types of electronic devices. For example, an electronic device may include at least one of a smartphone, a tablet personal computer (PC), a mobile phone, a video phone, an electronic book (e-book) reader, a desktop PC, a laptop PC, a netbook computer, a workstation server, a personal digital assistant (PDA), a portable multimedia player (PMP), an Moving Picture Experts Group phase 1 or phase 2 (MPEG-1 or MPEG-2) audio layer 3 (MP3) player, a mobile medical appliance, a camera, and a wearable device (e.g., smart glasses, a head-mounted-device (HIVID), electronic clothes, an electronic bracelet, an electronic necklace, an electronic appcessory, electronic tattoos, a smart mirror, or a smart watch).

Referring to FIG. 1, the wireless charging system may include a wireless power transmitter 100 and at least one of wireless power receivers 110-1, 110-2, and 110-n.

The wireless power transmitter 100 may wirelessly transmit powers 1-1 and 1-2 through 1-n to at least one of wireless power receivers 110-1 and 110-2 through 110-n. More specifically, the wireless power transmitter 100 may wirelessly transmit the powers 1-1 and 1-2 through 1-n only for an authenticated wireless power receiver that performs an authentication procedure.

The wireless power transmitter 100 may form an electric connection with the wireless power receivers 110-1 and 110-2 through 110-n. For example, the wireless power transmitter 100 may transmit wireless power in the form of electromagnetic waves to the wireless power receivers 110-1 and 110-2 through 110-n. Herein, the wireless power transmitter 100 may transmit wireless power based on an induction scheme or a resonance scheme.

Meanwhile, the wireless power transmitter 100 may perform bidirectional communication with the wireless power receivers 110-1 and 110-2 through 110-n. The wireless power transmitter 100 and the wireless power receivers 110-1 and 110-2 through 110-n may process, transmit or receive packets 2-1 and 2-2 through 2-n configured with frames. The wireless power receivers 110-1 and 110-2 through 110-n may be implemented with, e.g., a mobile communication terminal, a personal digital assistant (PDA), a portable multimedia player (PMP), a smartphone, etc.

The wireless power transmitter 100 may wirelessly provide power to a plurality of wireless power receivers 110-1 and 110-2 through 110-n. For example, the wireless power transmitter 100 may transmit power to the plurality of wireless power receivers 110-1 and 110-2 through 110-n by using the resonance scheme. When the wireless power transmitter 100 adopts the resonance scheme, the distance between the wireless power transmitter 100 and the plurality of wireless power receivers 110-1 and 110-2 through 110-n may be the distance for operation in an indoor environment. When the wireless power transmitter 100 adopts the electromagnetic induction scheme, the distance between the wireless power transmitter 100 and the plurality of wireless power receivers 110-1 and 110-2 through 110-n may be equal to or less than, for example, 10 cm.

The wireless power receivers 110-1 and 110-2 through 110-n each may charge a battery included therein with the wireless power received from the wireless power transmitter 100. The wireless power receivers 110-1 and 110-2 through 110-n each may transmit a signal for requesting wireless power transmission, information needed for wireless power reception, wireless power receiver state information, control information for the wireless power transmitter 100, etc., to the wireless power transmitter 100.

The wireless power receivers 110-1 and 110-2 through 110-n each may transmit a message indicating a charging state thereof to the wireless power transmitter 100.

The wireless power transmitter 100 may include a display means such as a display and display the state of each of the wireless power receivers 110-1 and 110-2 through 110-n based on the message received from each of the wireless power receivers 110-1 and 110-2 through 110-n. The wireless power transmitter 100 may also display the time expected to be needed until completion of charging of each of the wireless power receivers 110-1 and 110-2 through 110-n.

The wireless power transmitter 100 may transmit a control signal for disabling a wireless charging function to each of the wireless power receivers 110-1 and 110-2 through 110-n. The wireless power receivers 110-1 and 110-2 through 110-n, having received the control signal for disabling the wireless charging function from the wireless power transmitter 100, may disable the wireless charging function.

Figure 2:
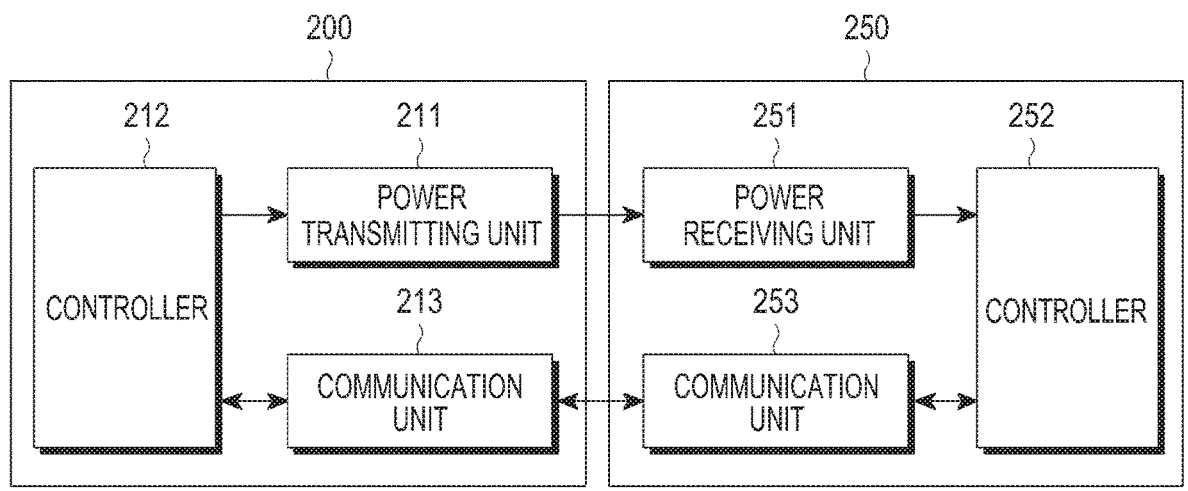
FIG. 2 is a block diagram for describing structures of a wireless power transmitter and a wireless power receiver of the disclosure.

FIG. 2 is a block diagram for describing structures of a wireless power transmitter and a wireless power receiver of the disclosure.

Referring to FIG. 2, the wireless power transmitter 200 may include a power transmission unit 211, a controller 212 (e.g., at least one processor), and a communication module 213. A wireless power receiver 250 may include a power reception unit 251, a controller 252 (e.g., at least one processor), and a communication module 253. However, the structures of the wireless power transmitter 200 and the wireless power receiver 250 are intended to describe some embodiments and may change depending on the embodiment.

The power transmission unit 211 may provide the power required by the wireless power transmitter 200 and wirelessly provide power to the wireless power receiver 250. Herein, the power transmission unit 211 may provide power in the form of alternating current (AC) waves, and may also invert power in the form of direct current (DC) waves into power in the form of the AC waves by using an inverter and provide the power in the form of the AC waves. The power transmission unit 211 may be implemented in the form of a built-in battery or may be implemented in the form of a power reception interface to receive power from an external source and to provide the received power to another component. It would be understood by those of ordinary skill in the art that the power transmission unit 211 is not limited as long as it is capable of providing power in a specific AC waveform.

The power transmission unit 211 may also provide an AC waveform to the wireless power receiver 250. The power transmission unit 211 may further include a resonant circuit or an inductive circuit and may transmit or receive electromagnetic waves accordingly. When the power transmission unit 211 is implemented with the resonant circuit, an inductance L of a loop coil of the resonant circuit may be changed. It would be understood by those of ordinary skill in the art that the power transmission unit 211 is not limited as long as it is capable of transmitting and receiving electromagnetic waves.

The controller 212 may control overall operations of the wireless power transmitter 200. The controller 212 or the controller 252 may control the overall operation of the wireless power transmitter 200 by using an algorithm, a program, or an application that is read from a storage unit (not shown) and is required for control. The controller 212 may be implemented in the form of a central processing unit (CPU), a microprocessor, a mini-computer, or the like. Meanwhile, the controller 122 may control overall operations of the wireless power transmitter 200.

The communication module 213 may perform communication with the wireless power receiver 250 in a specific manner. The communication module 213 may communicate with the communication module 251 of the wireless power receiver 250 by using near field communication (NFC), Zigbee communication, infrared communication, visible ray communication, Bluetooth communication, Bluetooth Low Energy (BLE), etc. The communication module 213 may use a carrier sense multiple access/collision avoidance (CSMA/CA) algorithm. The above-described communication scheme is merely an example, and the scope of embodiments of the disclosure is not limited to a specific communication scheme executed by the communication module 213.

Meanwhile, the communication module 213 may transmit a signal related to information of the wireless power transmitter 200. Herein, the communication module 213 may unicast, multicast, or broadcast the signal.

The communication module 213 may receive power information from the wireless power receiver 250. The power information may include at least one of the capacity, the remaining battery capacity, the number of charging times, the amount of use, the battery capacity, and the battery rate of the wireless power receiver 250.

The communication module 213 may transmit a charging function control signal for controlling a charging function of the wireless power receiver 250. The charging function control signal may be a control signal for enabling or disabling a charging function by controlling the wireless power reception unit 251 of the wireless power receiver 250.

The communication module 213 may receive a signal from another wireless power transmitter (not shown) as well as the wireless power receiver 250.

The wireless power transmitter 200 and the wireless power receiver 250 may transmit and receive various signals, such that subscription of the wireless power receiver 250 to a wireless power network in charge of the wireless power transmitter 200 and charging based on wireless power transmission and reception may be performed.

The power reception unit 251 may receive wireless power from the power transmission unit 211 based on the induction scheme or the resonance scheme.

Figure 3:
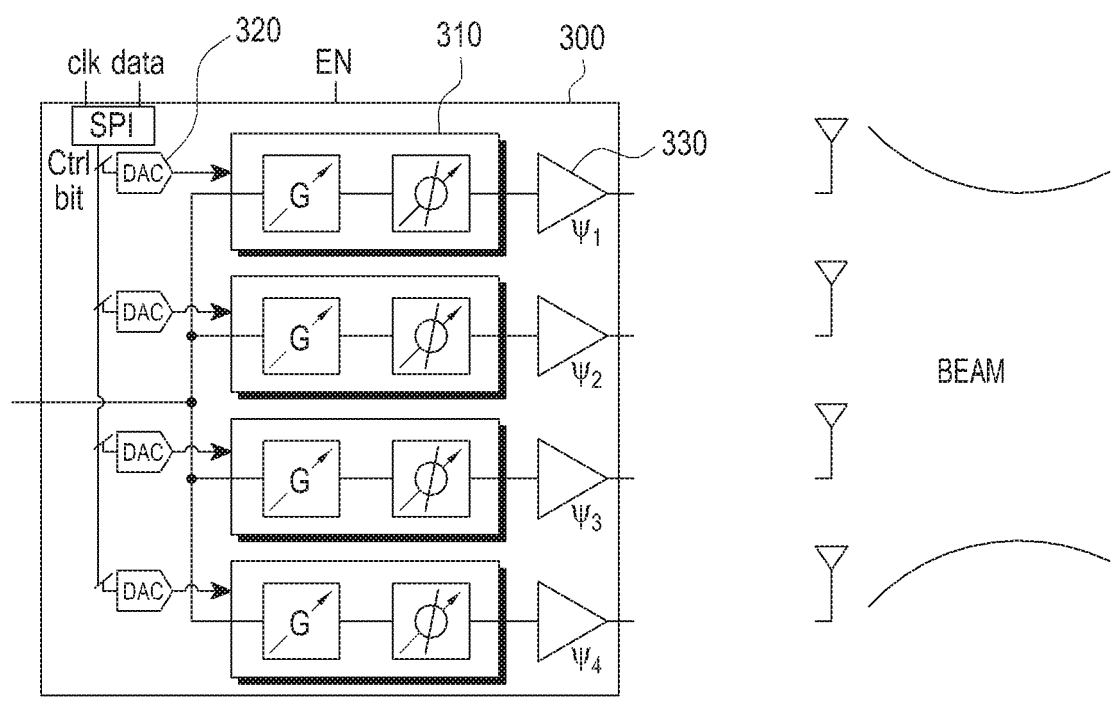
FIG. 3 is a conceptual view for describing an example of a structure of a 4-channel beamforming power transmission unit according to some embodiments of the disclosure.

FIG. 3 is a conceptual view for describing an example of a structure of a power transmission unit configured based on 4-channel beamforming according to some embodiments of the disclosure.

Figure 4:
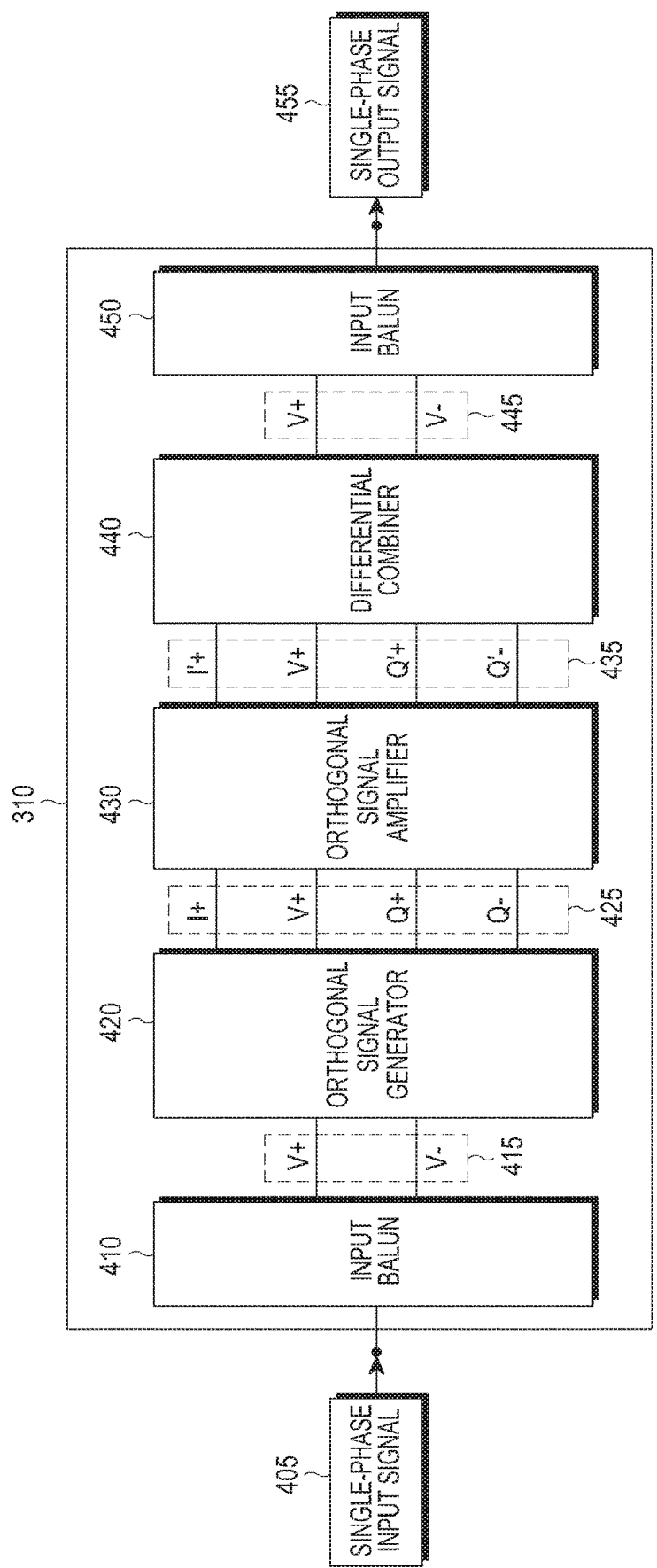
FIG. 4 is a block diagram for describing a structure and an operation of a phase controller according to some embodiments of the disclosure.

Referring to FIG. 3 is intended for some embodiments, and the embodiments are not limited to the configuration shown in FIG. 3. In particular, FIG. 4 illustrates a structure of a hardware platform 300 that forms the power transmission unit 211 and performs 4-channel beamforming.

The hardware platform 300, according to some embodiments, may be configured based on beamforming that forms a beam of AC waveform signals for supplying power to improve the energy efficiency of the system. In a conventional smart antenna system, beamforming means a method for transmitting and receiving data in a desired direction by controlling the phase of each of signals output through several arranged antenna arrays. In the current embodiment, beamforming for a signal that transmits power means a method for transmitting power in a desired direction.

Digital beamforming conventionally used in an artificial satellite, a ladar system, etc. uses a phased array system wherein a number of antennas are used. However, the phased array system needs multiple antennas and has high system complexity, such that digital beamforming is not appropriate for application to the wireless power transmission system. Thus, analog beamforming may be used, which forms a phase array in a radio frequency (RF) stage by using a phase controller 310 (e.g., at least one processor) that shifts the phase of an input signal according to the current embodiment.

The hardware platform 300 configured based on 4-channel beamforming may include the phase controller 310 that modulates the phase of the input signal to transmit the input signal through four channels. According to some embodiments, the phase controller 310 may modulate a gain and the phase of the input signal under control of a digital-to-analog converter (DAC) 320. The hardware platform 300 may transmit an output signal modulated by the phase controller 310, which forms each channel, to a corresponding antenna through a buffer 330 to allow the output signal to form a beam. Depending on an embodiment, the buffer 330 may be configured as being included in the phase controller 310.

The phase controller 310 may be configured by combining a gain variable amplifier capable of modulating the amplitude of a signal with a phase shifter capable of shifting the phase of the signal. The gain variable amplifier may compensate for a channel-specific gain error by performing gain control and assign a proper gain weight to suppress a side lobe component. The gain variable amplifier may be configured as a variable gain amplifier (VGA) or an attenuator. The phase shifter may modulate the phase of a channel-specific signal such that output signals output for respective channels (e.g., a first output signal, a second output signal, a third output signal, and a fourth output signal) have phase differences therebetween to form a beam. The phase shifter may achieve the desired target phase shift by combining delay lines using a switch. For example, when the phase shifter includes delay lines that generate phase delays of 22.5 degrees, 45 degrees, 90 degrees, and 180 degrees, respectively, the phase shifter may configure a circuit to generate a 135-degree phase shift in such a way that a signal detours the 45-degree delay line and the 90-degree delay line by controlling a switch.

However, the phase controller 310 configured by combining the gain variable amplifier with the phase shifter, which are separately designed, may have difficulty in controlling a gain and a phase independently. When the separately designed gain variable amplifier is combined with the separately designed phase shifter, a phase state of the phase shifter, that is, a phase-shifting operation of the phase shifter affects a gain of the gain variable amplifier, failing to amplify a gain of a signal according to a desired gain control value. On the other hand, a phase difference of a signal shifted by the phase shifter according to a gain state of the gain variable amplifier may not be controlled according to a desired phase control value (a phase difference to be controlled by a phase controller). For an existing VGA, an adjustable attenuation range without a phase change is limited, and for an attenuator, a large insertion loss may occur. For a structure that generates a phase delay using a delay line, various delay lines are required to increase a resolution for phase control, increasing circuit size. Hereinbelow, a description will be made of a vector sum circuit, a phase controller, and a semiconductor chip, which are designed in a single block to independently control a phase and a gain, may be miniaturized, and may reduce phase and amplitude errors.

FIG. 4 is a block diagram for describing a structure and an operation of the phase controller 310 according to some embodiments of the disclosure.

According to some embodiments, the phase controller 310 may include an orthogonal signal generator 420, an orthogonal signal amplifier 430, and a differential combiner 440. The phase controller 310 may further include an input balun 410 and an output balun 450.

Referring to FIG. 4, the phase controller 310 may receive a single-phase input signal 405 to be transmitted to the wireless power receiver. Herein, the input signal 405 as a single-phase signal is intended to describe some embodiments, but the input signal 405 is not limited thereto.

Once the single-phase input signal 405 is input to the input balun 410, the input balun 410 may be configured to transform the single-phase input signal 405 into a differential input signal 415 for driving the orthogonal signal generator 420. For example, the input balun 410 may be configured with a transmission line transformer (TLT), and may connect the differential input signal 415 that is an output of a power line transformer to the orthogonal signal generator 420 to perform a balun function. Herein, the input balun 410 may further execute a matching network function between an input terminal and the phase controller 310.

When the differential input signal 415 is input to the orthogonal signal generator 420, the orthogonal signal generator 420 may output an orthogonal signal 425 corresponding to the differential input signal 415. The orthogonal signal 425 means an orthogonal phase signal in which signals included therein are orthogonal to each other. The orthogonal signal generator 420 may be implemented in various ways. For example, the orthogonal signal generator 420 may be configured with a combiner that generates a signal at a frequency of fLO/M, an M-times frequency multiplier, and a 90-degree phase shifter, or with a combiner that generates a signal at a frequency of (M*fLO), an M-times frequency divider, and a 90-degree phase shifter. The orthogonal signal generator 420 may be implemented in various forms, for example, with a combiner including a quadrature voltage-controlled oscillator (QVCO). Herein, the orthogonal signal 425 indicates a 2D signal that presents a value at a specific time as one complex number. The complex number is divided into two parts: a real part and an imaginary part. The real part and the imaginary part are referred to as an "in-phase" and a "quadrature phase" and may be mentioned as I/Q signals with the initials thereof. Thus, the orthogonal signal 425 may be configured with phase-orthogonal signals sequentially having a phase difference of 90 degrees. For example, the orthogonal signal 425 may include an I+ signal, a Q+ signal, an I− signal, and a Q− signal. The orthogonal signal generator 420 may be configured to input the generated orthogonal signal 425 to the orthogonal signal amplifier 430. Herein, throughout the specification, the I+ signal and the I− signal may be mentioned as the I signal. The Q+ signal and the Q− signal may be mentioned as the Q signal.

The orthogonal signal amplifier 430 may output an orthogonal signal 435 in which the signals included in the orthogonal signal 425 are amplified. The orthogonal signal amplifier 430 may be configured by including one or more amplifiers capable of amplifying the signals included in the orthogonal signal 425. For example, the orthogonal signal amplifier 430 may output the amplified orthogonal signal 435 including an I'+ signal, a Q'+ signal, an I'− signal, and a Q'− signal that are amplified versions of the I+ signal, the Q+ signal, the I− signal, and the Q− signal of the orthogonal signal 425. The output of the orthogonal signal amplifier 430 may be connected to the differential combiner 440 such that the amplified orthogonal signal 435 is input to the differential combiner 440. The differential combiner 440 may generate a differential output signal 445 having a modulated phase such that the differential output signal 445 has a desired phase from the differential input signal 415 by combining the signals included in the input orthogonal signal 435. According to some embodiments, the orthogonal signal amplifier 430 may be configured using the orthogonal signal amplifier 430 that amplifies the signals (the I+ signal, the Q+ signal, the I− signal, and the Q− signal) included in the orthogonal signal 435 based on a phase control value. By combining the signals included in the orthogonal signal 435 amplified by the orthogonal signal amplifier 430, the phase-modulated signal may be generated. Herein, the phase controller 310 may control a gain of an amplifier included in the orthogonal signal amplifier 430 such that the differential output signal 445 output from the differential combiner 440 has a desired phase. According to some embodiments, the phase controller 310 may further include a controller 1200 to control the orthogonal signal amplifier 430. The differential output signal 445 may be output as a single-phase output signal 455 having a phase modulated from a phase of the single-phase input signal 405 through the output balun 450. According to some embodiments, the orthogonal signal amplifier 430 may be configured using a vector sum circuit. When the phase of a signal is controlled using a vector sum circuit according to the current embodiment, the resolution of phase control may be increased by improving the resolution of a controller for controlling the orthogonal signal amplifier 430 without changing an RF circuit (e.g., the addition of a delay line), thus reducing a circuit size.

Figure 5:
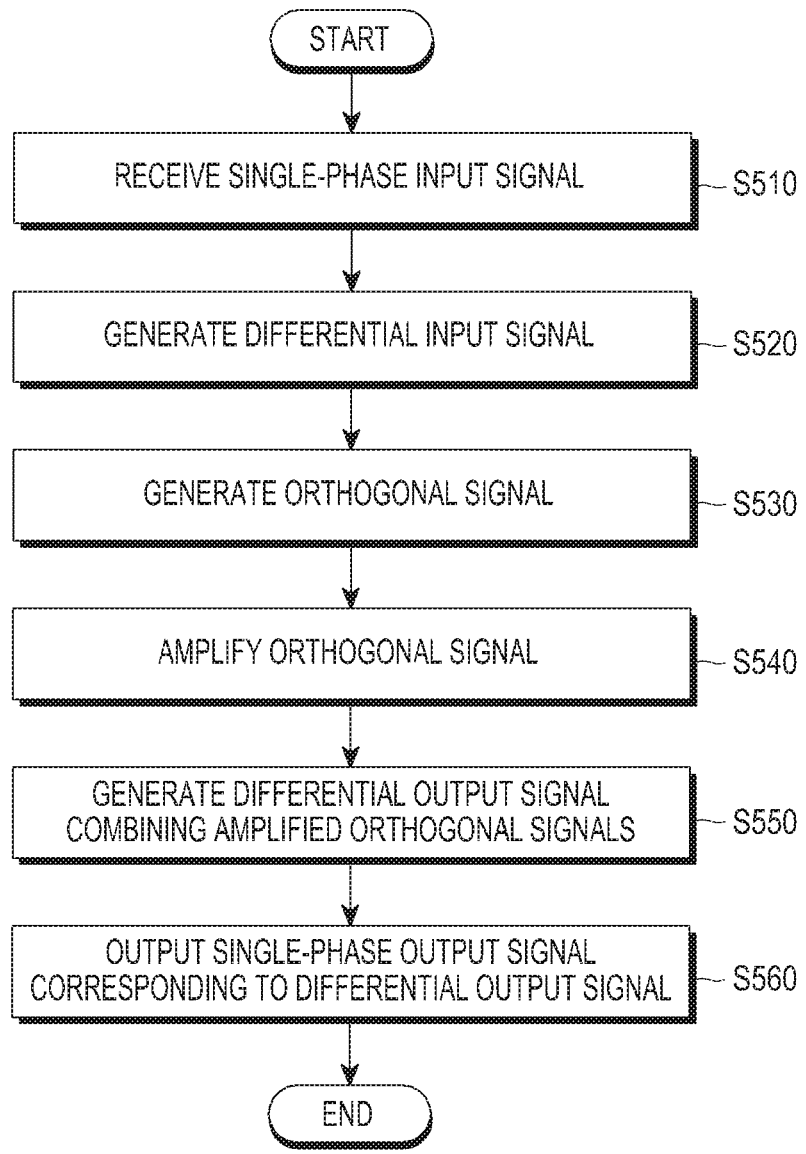
FIG. 5 is a flowchart for describing a process of controlling a phase of an input signal by a phase controller according to some embodiments of the disclosure.

FIG. 5 is a flowchart for describing a process of controlling the phase of an input signal by the phase controller 310 according to some embodiments of the disclosure.

Referring to FIG. 5, the phase controller 310, according to some embodiments, may receive the single-phase input signal 405 in operation S510. Herein, the single-phase input signal 405 may mean a signal to be transmitted to a wireless power receiver.

Figure 6:
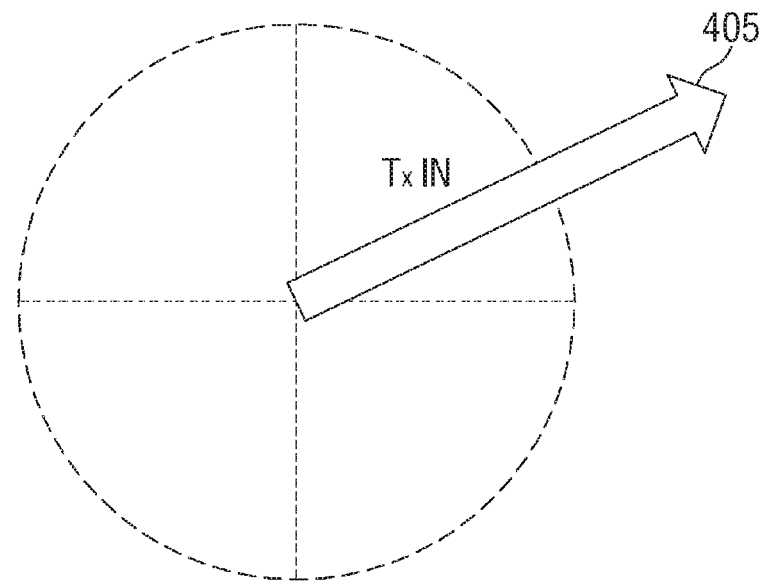
FIGS. 6, 7, 8, 9, 10, and 11 are conceptual diagrams for describing a process in which an input signal is modulated according to some embodiments of the disclosure.
Figure 7:
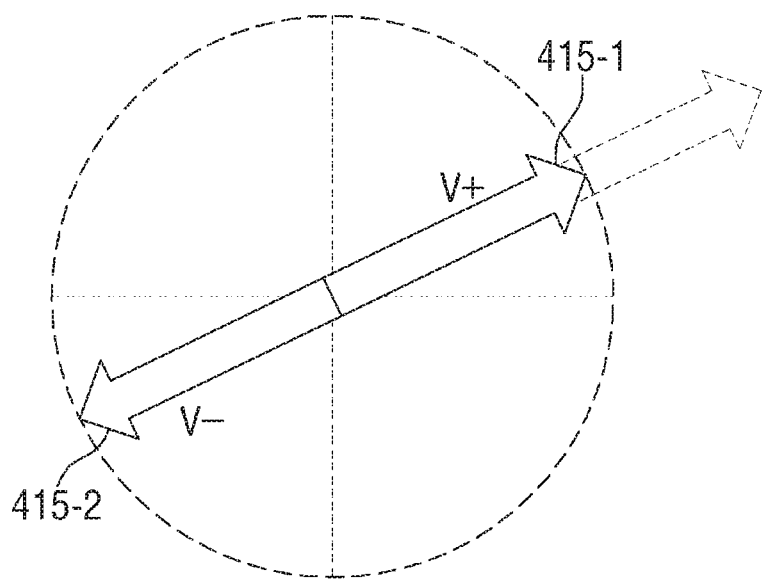

FIGS. 6 through 11 are conceptual diagrams for describing a process in which an input signal is modulated according to some embodiments of the disclosure;

For example, referring to FIG. 6, the single-phase input signal 405 expressed as a vector indicated on a complex number coordinate system may be input to the phase controller 310. Hereinbelow, for the convenience of a description, a vector indicating each signal will be mentioned as the signal.

In operation S520, the phase controller 310 may transform the input single-phase input signal 405 into a differential input signal through the input balun 410. For example, when the single-phase input signal 405 shown in FIG. 6 is generated as the differential input signal 415, the phase controller 310 may transform the single-phase input signal 405 into the differential input signal 415 including a V+ signal 415-1 and a V− signal 415-2.

Figure 8:
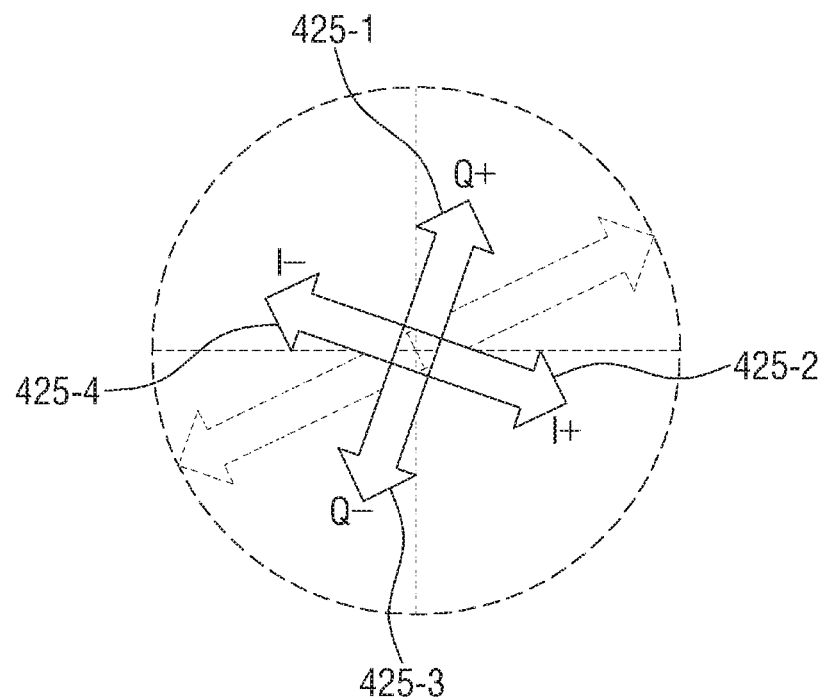
Figure 9:
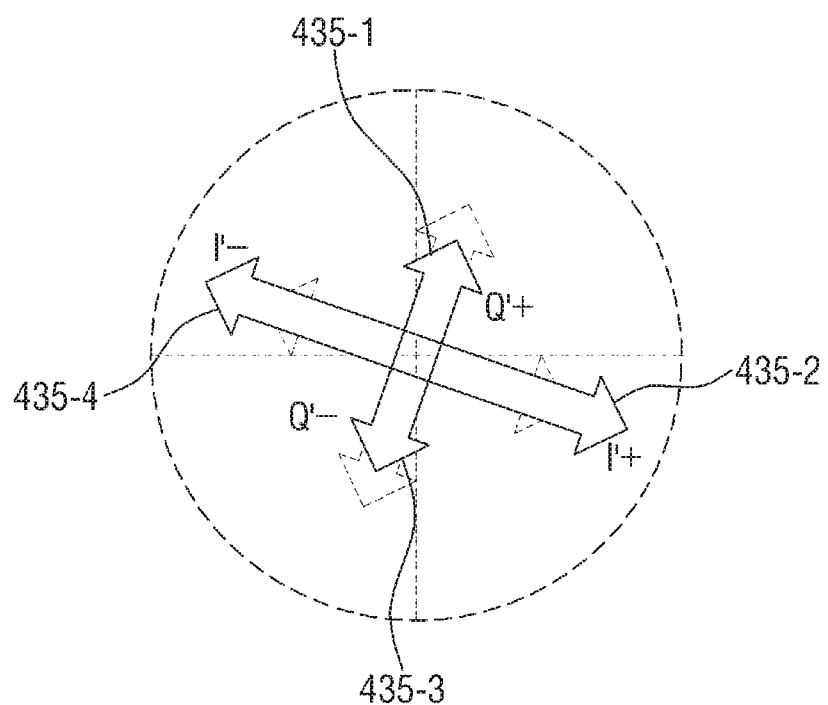
Figure 10:
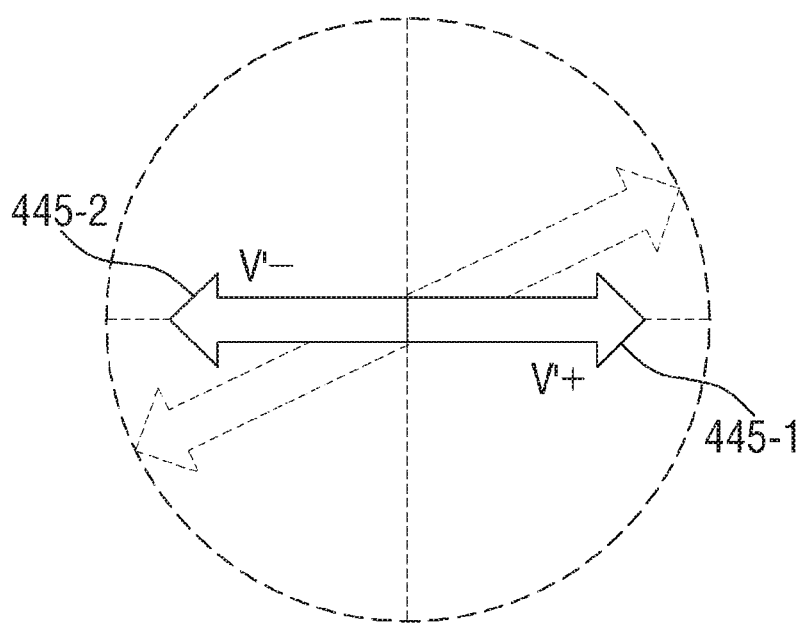

In operation S530, the phase controller 310 may generate the orthogonal signal 425 from the differential input signal 415 output by the input balun 410, by using an orthogonal signal generator. For example, as shown in FIG. 8, the phase controller 310 may generate orthogonal signals (a Q+ signal 425-1, an I+ signal 425-2, a Q− signal 425-3, and an I+ signal 425-4) by using the differential input signal 415.

In operation S540, the phase controller 310 may amplify the orthogonal signal 425 generated in operation S530. The phase controller 310 may amplify the Q+ signal 425-1, the I+ signal 425-2, the Q− signal 425-3, and the I+ signal 425-4 shown in FIG. 8 into a Q'+ signal 435-1, an I'+ signal 435-2, a Q'− signal 435-3, and an I'− signal 435-4 shown in FIG. 9.

In operation S550, the phase controller 310 may generate the differential output signal 445 combining the amplified signals included in the orthogonal signal 435. For example, referring to FIG. 10, by combining the amplified signals included in the orthogonal signal 435, the differential output signal 445 including a V'+ signal 445-1 and a V'− signal 445-2, which has a phase modulated from a phase of the differential input signal 415 shown in FIG. 7, may be generated.

Figure 11:
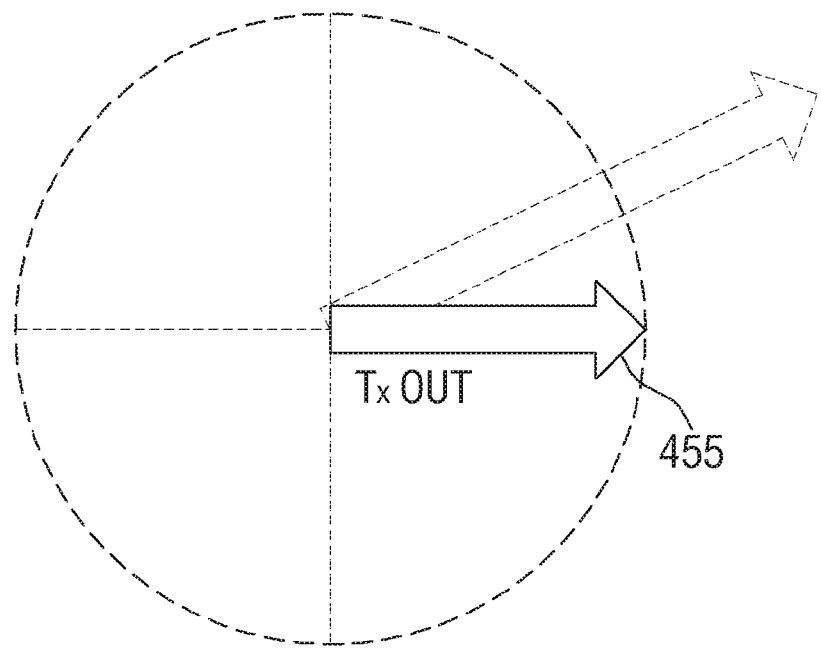

In operation S560, once the differential output signal 445 passes through the output balun 450, the single-phase output signal 455 corresponding to the differential output signal 445 may be output. Referring to FIG. 11, the phase controller 310 may output the single-phase output signal 455 having a phase modulated from a phase of the single-phase input signal 405 shown in FIG. 6.

Figure 12:
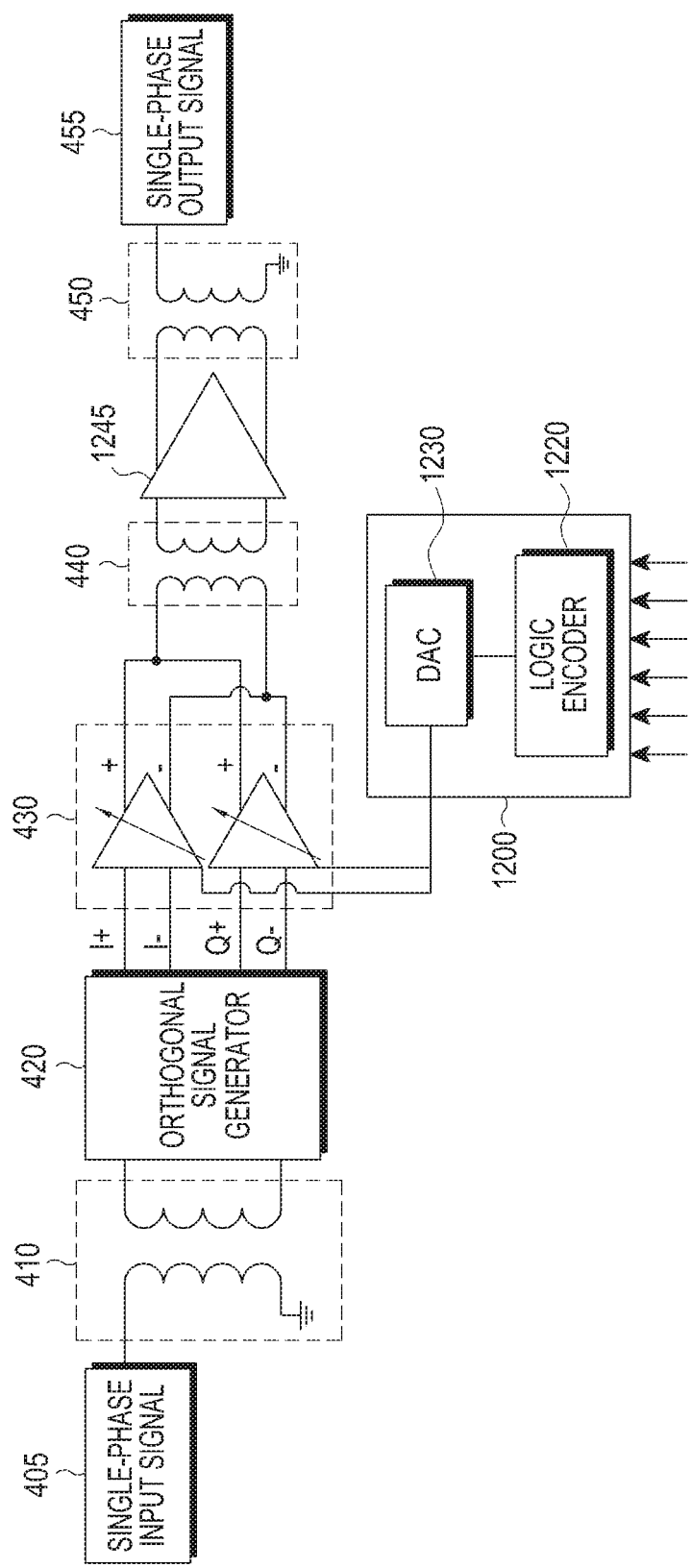
FIG. 12 is a diagram showing a structure of a phase controller according to another embodiment of the disclosure.

FIG. 12 is a diagram showing a structure of the phase controller 310 according to another embodiment.

The phase controller 310 may include the input balun 410 that receives the single-phase input signal 405; the orthogonal signal generator 420 that receives the differential input signal 415 output from the input balun 410; the orthogonal signal amplifier 430 that receives the orthogonal signal 425 output from the orthogonal signal generator 420; the controller 1200 that controls the gain of the amplifier included in the orthogonal signal amplifier 430; the differential combiner 440 that outputs the differential output signal 445 upon inputting the output of the orthogonal signal amplifier 430; a buffer 1245; and the output balun 450.

Referring to FIG. 12, according to the current embodiment, the input balun 410 may be configured using an input TLT. The input TLT may transform the single-phase input signal 405 into the differential input signal 415. Herein, the single-phase input signal 405 may mean RF power to be transmitted to the wireless power receiver 250. The input TLT of the input balun 410 may be configured such that a circuit thereof is in a conjugate matching state to reduce a loss that occurs when the single-phase input signal 405 is delivered to the orthogonal signal generator 420. Once passing through the input TLT, the single-phase input signal 405 may be transformed into the differential input signal 415 in which the signals included therein have a phase difference of 180 degrees.

The orthogonal signal amplifier 430 may receive the orthogonal signal 425 corresponding to the differential input signal 415 from the orthogonal signal generator 420. The orthogonal signal amplifier 430 may be configured using a vector sum circuit including one or more amplifiers having a gain controlled under the control of the controller 1200. Herein, the controller 1200 may be configured as a digital block including a logic encoder 1220 and a digital-to-analog converter (DAC) 1230.

The logic encoder 1220 may perform encoding with respect to digital input upon receiving the digital input from a device (e.g., a processor) that executes a program for performing wireless power transmission. According to the embodiment shown in FIG. 12, the logic encoder 1220 may encode a 6-bit digital input. However, the disclosure is not limited to this example. The logic encoder 1220 may deliver the encoded digital input to the DAC 1230. The DAC 1230 may generate an analog reference voltage corresponding to input bits. For the orthogonal signal amplifier 430 according to some embodiments, a gain for amplifying an orthogonal signal may be controlled by an analog reference voltage generated by the DAC 1230.

The orthogonal signal amplifier 430 may include an input unit (an input node) that receives the orthogonal signal 425 from the orthogonal signal generator 420 and one or more amplifiers that amplify an orthogonal signal (I+, I−, Q+, and Q− signals) based on a gain controlled by the DAC 1230. By combining the signals included in the orthogonal signal 435 amplified based on corresponding gains by the orthogonal signal amplifier 430, the phase-modulated differential output signal 425 may be generated from the differential input signal 425.

The differential combiner 440 may be configured using an inter-stage TLT. The inter-stage TLT may be connected with the orthogonal signal amplifier 430 and the buffer 1245 in order to transform the output of the orthogonal signal amplifier 430 into a differential signal and to input the transformed output to the buffer 1245. The inter-stage TLT of the differential combiner 440 may be configured such that differential-to-differential impedance matching between circuits at a side of the orthogonal signal amplifier 430 and a side of the buffer 1245 is made. The buffer 1245 may be configured to compensate for a loss that occurs due to the orthogonal signal amplifier 430. The phase controller 310 may have a favorable influence upon impedance matching at a terminal thereof by including the buffer 1245 at the terminal. Once the RF power amplified by the buffer 1245 finally passes through the output balun 450 configured with an output TLT, the RF power may be transformed into and output as the single-phase output signal 445 through a single terminal node.

Figure 13:
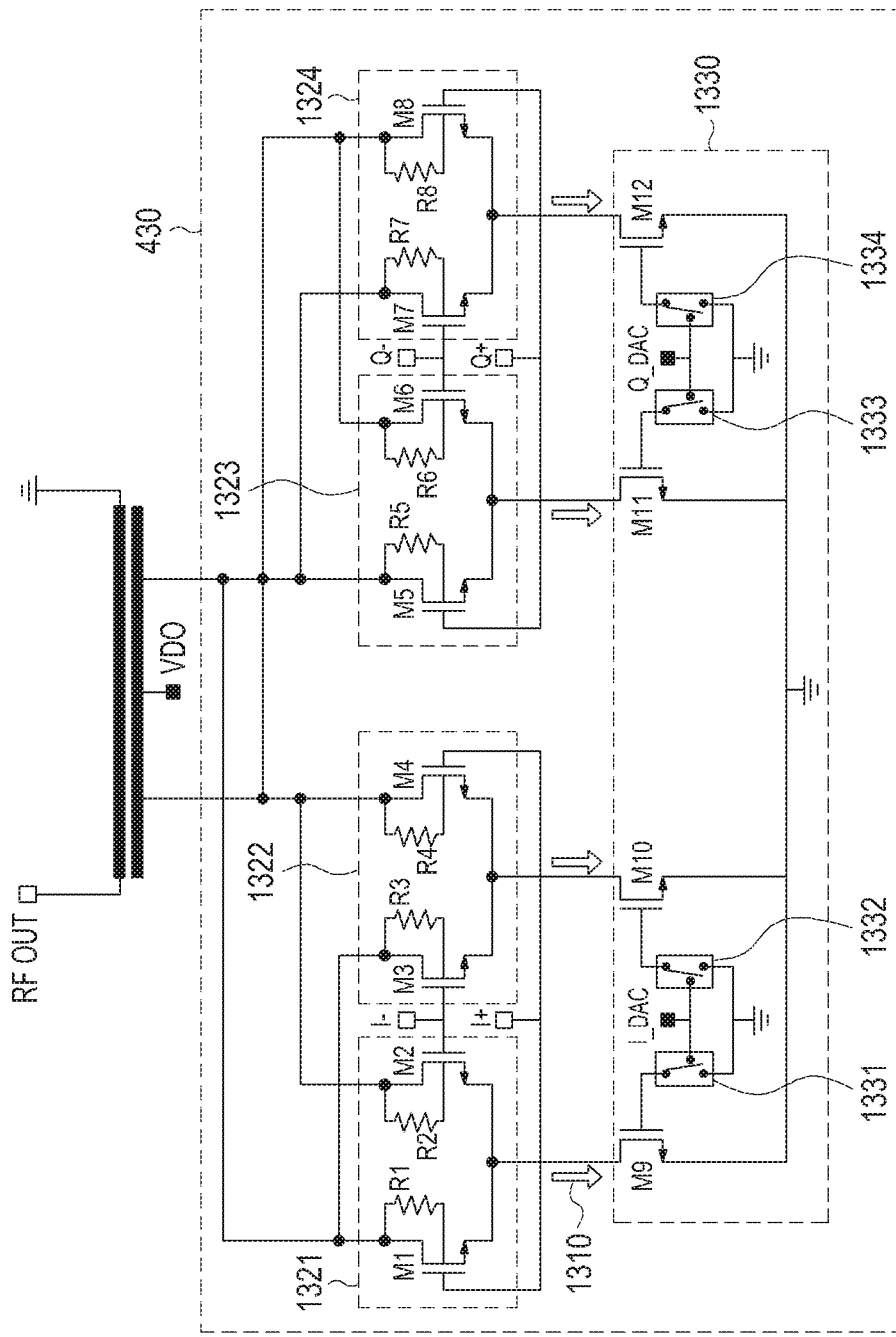
FIG. 13 illustrates a vector sum circuit included in a phase controller according to some embodiments of the disclosure.

FIG. 13 illustrates a vector sum circuit included in the phase controller 310 according to some embodiments of the disclosure.

Referring to FIG. 13, the orthogonal signal amplifier 430 configured using the vector sum circuit according to some embodiments may include a first amplifier 1321, a second amplifier 1323, a third amplifier 1322, and a fourth amplifier 1324 that amplify the orthogonal signal 425. Referring to FIG. 13, the first through fourth amplifiers 1321, 1323, 1322, and 1324 may include metal oxide semiconductor field effect transistors (MOSFETs) M1 through M8 configured to operate as amplifiers that amplify an orthogonal signal (I+, I−, Q+, and Q− signals). Referring to FIG. 13, the first through fourth amplifiers 1321, 1323, 1322, and 1324 may be configured to input a corresponding orthogonal signal (I+, I−, Q+, and Q− signals) to gates of the MOSFET M1 through M8 included therein.

More specifically, the first amplifier 1321 may include a first MOSFET M1 into which the I+ signal is input and a third MOSFET M2 into which the I− signal is input. Similarly, the third amplifier 1322 may include a MOSFET M4 into which the I+ signal is input and a MOSFET M3 into which the I− signal is input. Outputs of the first amplifier 1321 and the third amplifier 1322 are connected inversely with respect to each other.

The second amplifier 1323 may include a fourth MOSFET M5 into which the Q+ signal is input and a fifth MOSFET M6 into which the Q− signal is input. The fourth amplifier 1324 may include a MOSFET M8 into which the Q+ signal is input and a MOSFET M7 into which the Q− signal is input. Outputs of the second amplifier 1323 and the fourth amplifier 1324 are connected inversely with respect to each other.

The orthogonal signal amplifier 430 may further include a self body-biasing circuit configured to reduce the voltage applied to the body of a corresponding MOSFET as the current at drains of the MOSFETs M1 through M8 included in the amplifiers 1321, 1323, 1322, and 1324. For the orthogonal signal amplifier 430 shown in FIG. 13, the self body-biasing circuit may include resistors R1 through R8 that each connect a body and a drain of each of the MOSFETs M1 through M8.

Figure 20:
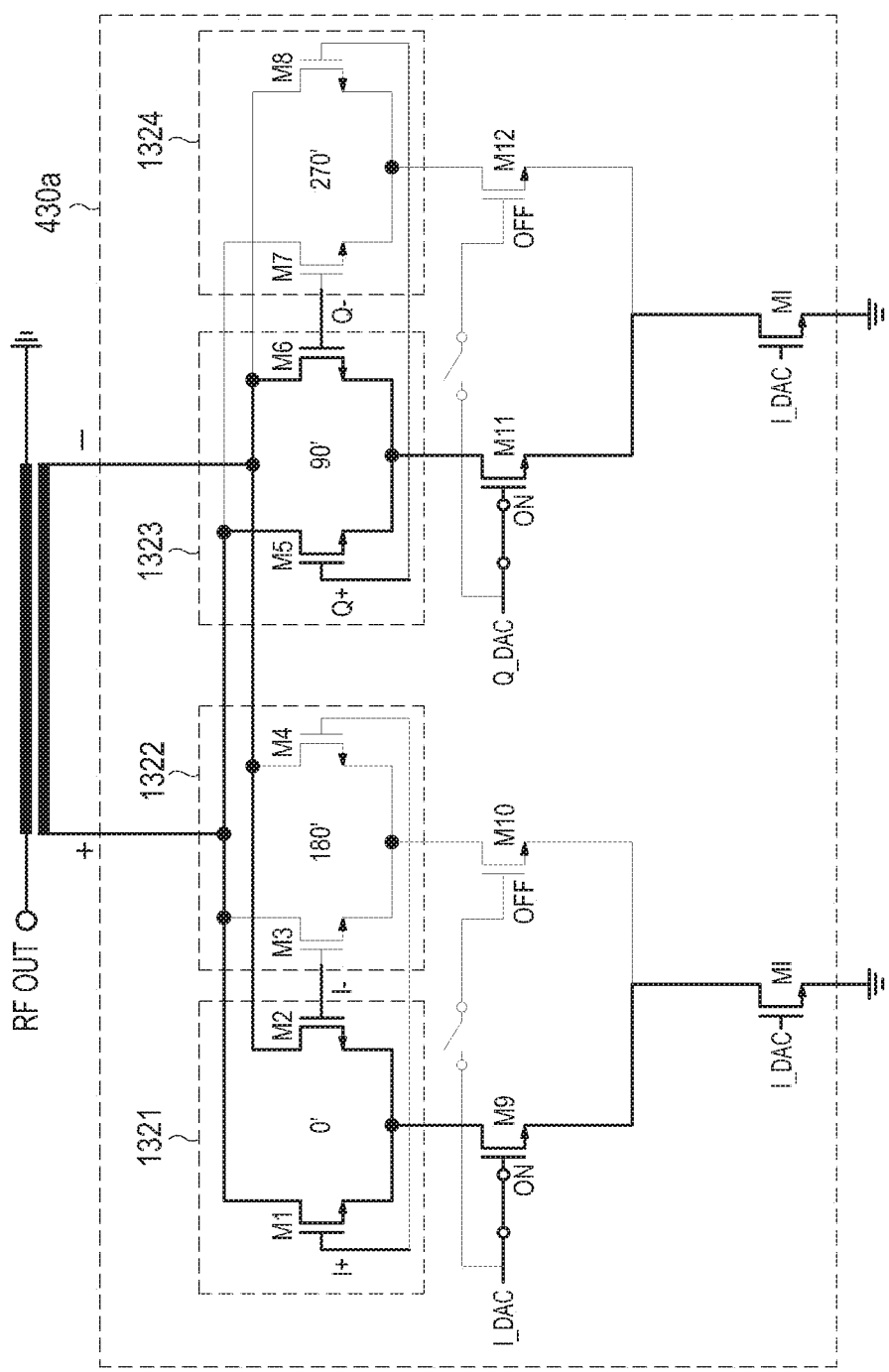
FIGS. 20 and 21 are conceptual diagrams for describing an operation of a vector sum circuit according to some embodiments of the disclosure.

The orthogonal signal amplifier 430 may further include an amplification controller 1330 that controls the tail current 1310 of each of the first through fourth amplifiers 1321, 1323, 1322, and 1324. The amplification controller 1330 may select an amplifier to be enabled from among the first through fourth amplifiers 1321, 1323, 1322, and 1324, according to which quadrant the phase difference to be controlled indicates. Herein, the amplification controller 1330 may include gain controllers M9, M10, M11 and M12 and switches 1331, 1332, 1333, and 1334. According to some embodiments, the gain controllers M9, M10, M11, and M12 may be configured with the MOSFETs connected at the tails of the first through fourth amplifiers 1321, 1323, 1322, and 1324. For example, referring to FIG. 20, sources of the first MOSFET M1 and the third MOSFET M2 of the first amplifier 1321 are connected to a drain of a second gain controller M9. Referring to FIG. 20, sources of the fourth MOSFET M5 and the fifth MOSFET M6 of the second amplifier 1323 are connected to a drain of a gain controller M11.

Figure 14:
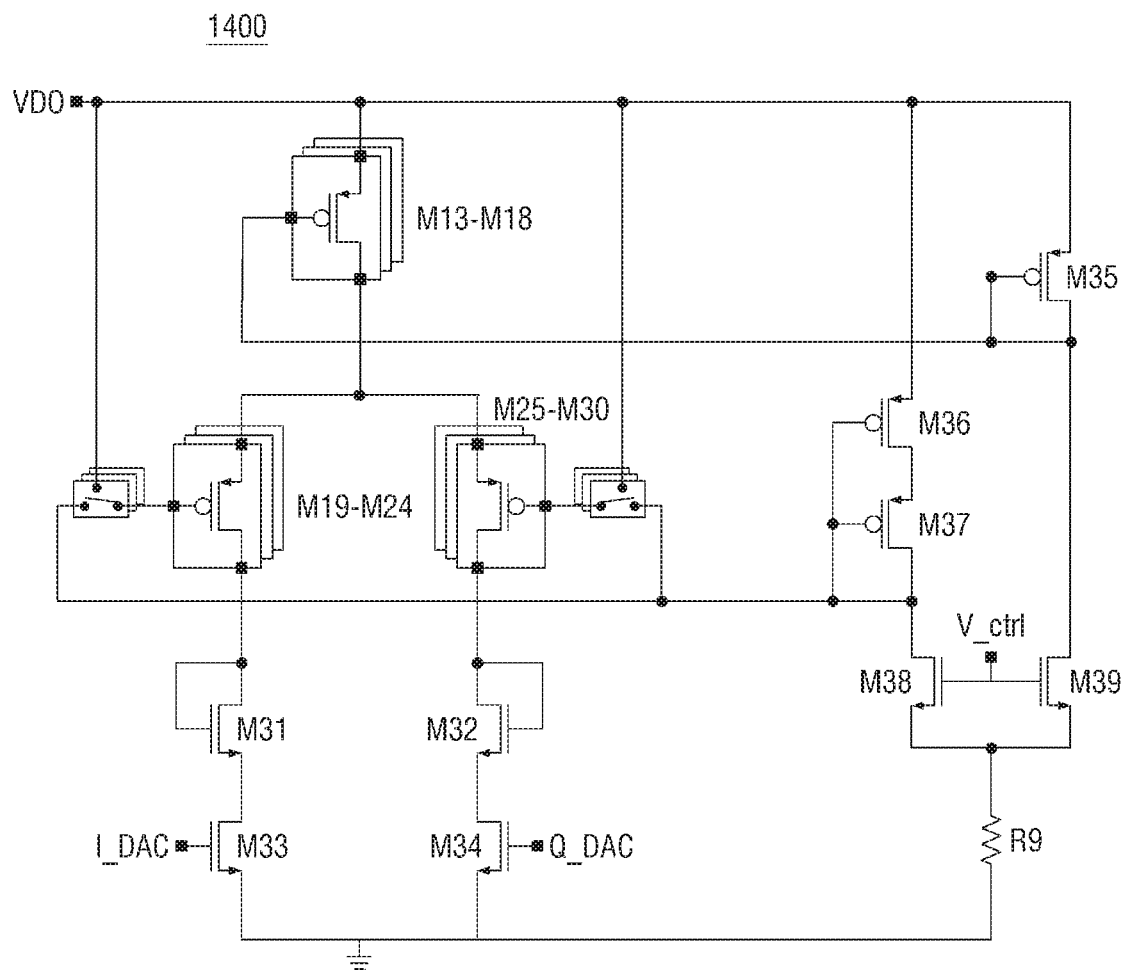
FIG. 14 illustrates an example of a current mirror circuit interlocked with a digital-to-analog converter (DAC) according to some embodiments of the disclosure.

The orthogonal signal amplifier 430 may further include the switches 1331, 1332, 1333, and 1334 that connect gates of the gain controllers M9, M10, M11, and M12 to output nodes I_DAC and Q_DAC of a current mirror circuit 1400 of FIG. 14 that mirrors the current of the DAC 1230 or to a ground node. The switches 1331, 1332, 1333, and 1334 may connect the gates of the gain controllers M9, M10, M11, and M12 to the output nodes I_DAC and Q_DAC of the current mirror circuit 1400 of FIG. 14. However, FIG. 13 pertains to an embodiment in which the gain controllers M9, M10, M11, and M12 are configured using an N-channel MOS (NMOS), and according to another embodiment (e.g., a vector sum circuit configured using a P-channel MOS (PMOS)), the configuration may be changed to perform the same function. The current mirror circuit 1400 may provide a specific rate of the output of the DAC 1230 to the gain controllers M9, M10, M11, and M12. According to some embodiments, the current mirror circuit 1400 may divide the current of the DAC 1230 into first current and second current. Current amounting to the first current may be induced as the tail current 1310 of one of the first amplifier 1321 and the third amplifier 1322 that amplify the I signals. Current amounting to the second current may be induced as the tail current 1310 of one of the second amplifier 1323 and the fourth amplifier 1324 that amplify the Q signals.

When the gates of the corresponding gain controllers M9, M10, M11, and M12 are connected to the ground node by operations of the corresponding switches 1331, 1332, 1333, and 1334, an amplifier connected at a gate thereof to the ground node, out of the first through fourth amplifiers 1321, 1323, 1322, and 1324, is disabled. When the gates of the corresponding gain controllers M9, M10, M11, and M12 are connected to the current mirror circuit 1400 by the operations of the corresponding switches 1331, 1332, 1333, and 1334, the first through fourth amplifiers 1321, 1323, 1322, and 1324 connected to the corresponding gain controllers M9, M10, M11, and M12 are enabled. Herein, due to an operation of the current mirror circuit 1400 included in the DAC 1230, a specific rate of the current of the DAC 1230 flows as the tail current 1310 of the corresponding enabled amplifiers 1321, 1323, 1322, and 1324. For example, referring to FIG. 20, the first amplifier 1321 and the second amplifier 1323 may be enabled, the first current may be induced to the first amplifier 1321, and the second current may be induced to the second amplifier 1323. When the gates of the corresponding gain controllers M9, M10, M11, and M12 are connected to the current mirror circuit 1400, a voltage amounting to an analog reference voltage generated by the DAC 1230 may be applied to the gates of the corresponding gain controllers M9, M10, M11, and M12. Thus, a specific rate of the current of the DAC 1230 flows as the tail current 1310 of the amplifier connected to the corresponding gain controllers M9, M10, M11, and M12. For example, referring to FIG. 20, since the sum of source currents of the MOSFETs M1 and M2 of the first amplifier 1321 is the tail current 1310 of the amplifier, the gain of the first amplifier 1321 may be controlled by the tail current 1310.

According to some embodiments, the first switch 1331 and the second switch 1332 among the switches 1331, 1332, 1333, and 1334 may operate to selectively enable one of the first amplifier 1321 and the second amplifier 1323. The third switch 1333 and the fourth switch 1334 may operate to selectively enable one of the third amplifier 1323 and the fourth amplifier 1324. The vector sum circuit, according to some embodiments, may determine a quadrant of a complex coordinate system where a phase difference to be controlled for an input signal is located, by selectively enabling the first through fourth amplifiers 1321, 1323, 1322, and 1324.

When the tail current 1310 for determining a gain of each amplifier is separately controlled to adjust the phase of the input signal, the drain current of the amplifier is changed. Once the drain current of the amplifier is changed, a region where the MOSFETs M1 through M8 operating as the amplifiers operate may transit from a cutoff region to a saturation region. In this case, a variation of an output capacitance may greatly increase. The increase in the variation of the output capacitance causes non-linearity, increasing a possibility of an error for phase control. However, when compared to a structure where a body is connected to a source or a structure using a fixed body bias, according to the current embodiment including the self body-biasing circuit, the voltage applied to the body gradually decreases as current flowing at the drain of the amplifier increases, thus largely reducing the variation of the output capacitance.

To stably amplify and mirror current from the DAC 1230, the gain controllers M9, M10, M11, and M12 need to operate in the saturation region. Also, since the tail current 1310 of the amplifiers 1321, 1323, 1322, and 1324 has to be controlled for phase shifting, the total current may need to be increased. However, when the total current is increased to control the tail current 1310 of the amplifiers 1321, 1323, 1322, and 1324, drain voltages of the gain controllers M9, M10, M11, and M12 gradually decrease. Thus, as the drain voltages of the gain controllers M9, M10, M11, and M12 decrease, the operating regions of the gain controllers M9, M10, M11, and M12 may leave the saturation region. When the operating regions of the gain controllers M9, M10, M11, and M12 leave the saturation region, the non-linearity of the circuit occurs, causing an error in phase or amplitude. However, when the self body-biasing circuit is included as in the current embodiment, the drain voltages of the gain controllers M9, M10, M11, and M12 may be increased. Thus, according to the current embodiment, the phase controller 310 may operate while maintaining linearity even when high total current flows.

The phase controller 310, according to some embodiments, may modulate the phase of an input signal by using the orthogonal signal amplifier 430 configured as a single block as shown in FIG. 13. In this way, the phase controller 310, according to some embodiments, may reduce the possibility of an error resulting from phase control.

FIG. 14 illustrates an example of a current mirror circuit of a DAC according to some embodiments of the disclosure.

Referring to FIG. 14, according to some embodiments, a reference voltage corresponding to input bits may be applied to the DAC 1230. Herein, the reference voltage is used for the DAC 1230 to control the phase controller 310, and may be applied from the DAC 1230 or the outside of the DAC 1230. As the reference voltage increases, the current generated in the DAC 1230 may increase. The voltage generated by the DAC 1230 may be input to a node V_ctrl of the current mirror circuit 1400. The voltage generated by the DAC 1230 is applied to a gate of a MOSFET M38, and a drain voltage of the MOSFET M38 or a voltage of a reference voltage node VDO is selectively applied to MOSFETs of a MOSFET group including MOSFETs M19 through M30 according to an operation of a switch. Referring to FIG. 14, a MOSFET group including MOSFETs M19 through M24 and a MOSFET group including MOSFETs M25 through M30 are connected in parallel to a MOSFET group including MOSFETs M13 through M18. Thus, as the gate voltage of the MOSFET group including MOSFETs M19 through M30 is controlled, the current of the MOSFET group including MOSFETs M13 through M18 connected to the reference voltage node VDO separately flows to the MOSFET M33 and the MOSFET M34. That is, out of the current of the DAC 1230, the first current flows to the MOSFET M33 and the second current flows to the MOSFET M34. Herein, the DAC 1230 may determine the rates of the first current and the second current according to a phase control value for controlling the phase of the single-phase input signal 405. A gate of the MOSFET M33 (a first output node I_DAC) and a gate of the MOSFET M34 (a second output node Q_DAC) may be connected to the gates of the gain controllers M9, M10, M11, and M12 to allow the gain controllers M9, M10, M11, and M12 to control the tail current 1310 of the amplifiers 1321, 1323, 1322, and 1324. When the tail current 1310 of the amplifiers 1321, 1323, 1322, and 1324 is controlled through the current mirror circuit 1400 shown in FIG. 14, the rate of the tail current 1310 applied to each amplifier may be controlled while maintaining the total sum of the tail current 1310.

Figure 15:
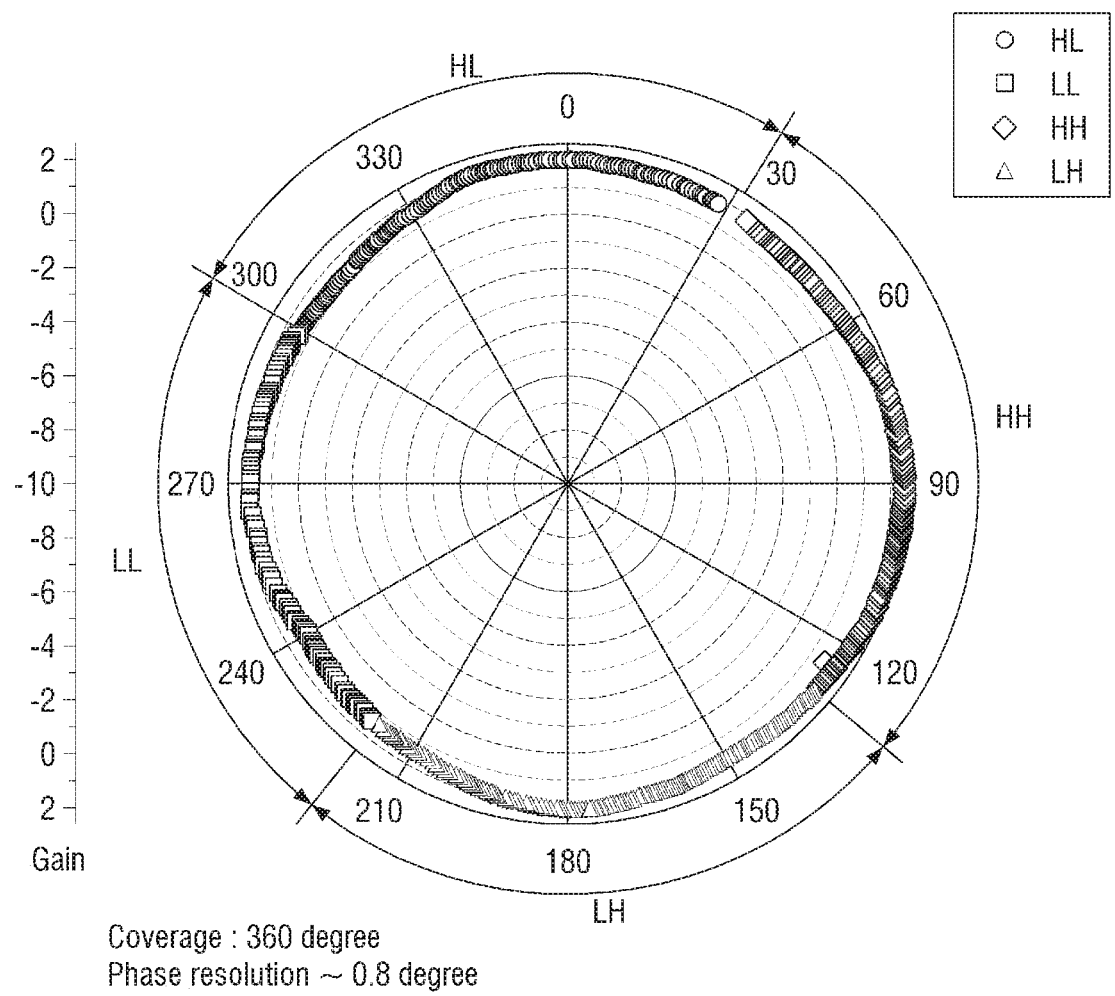
FIG. 15 is a diagram showing a phase control coverage and a phase resolution of a phase controller according to some embodiments of the disclosure.

FIG. 15 is a diagram showing a phase control coverage and a phase resolution of a phase controller according to some embodiments of the disclosure.

Referring to FIG. 15, HH means phase control values when the first amplifier 1321 and the second amplifier 1323 are enabled. HL means phase control values when the first amplifier 1321 and the fourth amplifier 1324 are enabled. LH means phase control values when the second amplifier 1323 and the third amplifier 1322 are enabled. LL means phase control values when the third amplifier 1322 and the fourth amplifier 1324 are enabled. In FIG. 15, a vertical axis indicates a gain and a value around a circle means a phase.

According to some embodiments, as shown in FIG. 15, a phase controller having a high phase control resolution of about 0.8 degrees and a phase control coverage of 360 degrees may be configured.

Figure 16:
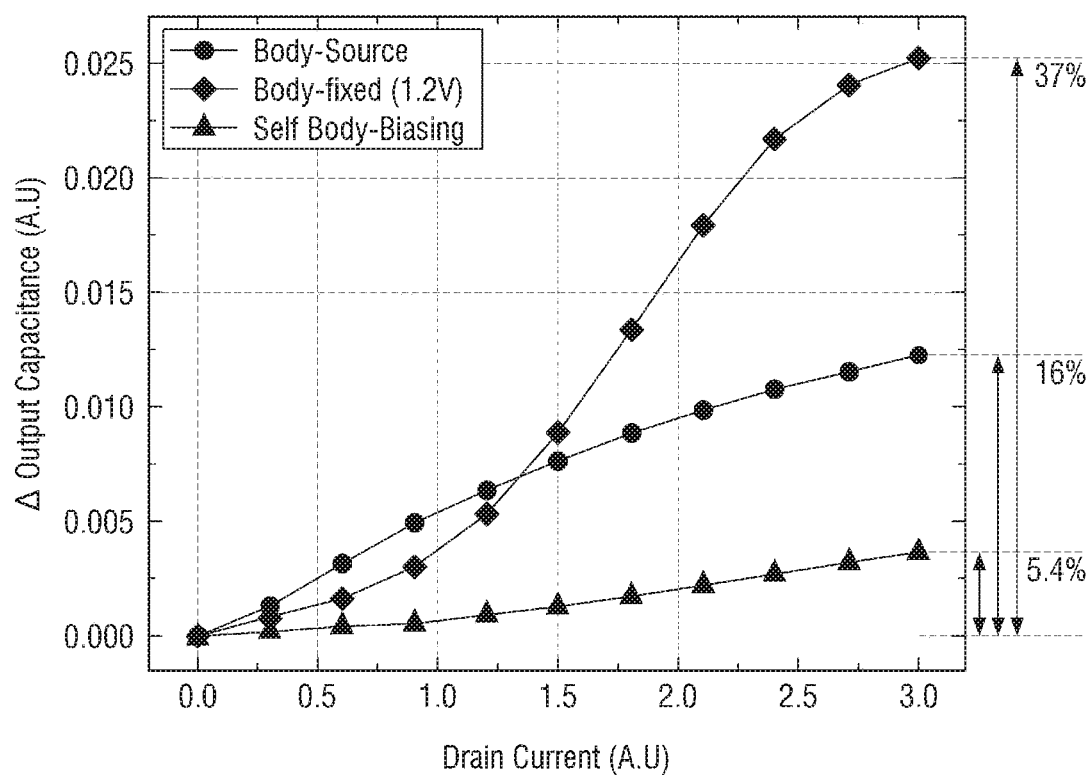
FIG. 16 is a graph showing a variation of an output capacitance with respect to a variation of a drain current of a vector sum circuit according to some embodiments of the disclosure.

FIG. 16 is a graph showing a variation of an output capacitance with respect to a variation of a drain current of the amplifiers 1321, 1323, 1322, and 1324 according to some embodiments of the disclosure.

The horizontal axis of a graph shown in FIG. 16 means a drain current of the amplifiers 1321, 1323, 1322, and 1324. The vertical axis of the graph shown in FIG. 16 means a variation of an output capacitance of the phase controller 310.

Referring to FIG. 16, when a phase shifter is configured using an amplifier connecting a body and a source (Body-Source), an output capacitance changes by about 16% as drain current increases. When a phase shifter is configured using an amplifier fixing a body voltage (Body-fixed (1.2V)), the output capacitance changes by about 37% as the drain current increases. On the other hand, for the phase controller 310 using the self body-biasing circuit according to some embodiments, a variation of an output capacitance is limited to about 5.4%.

That is, the phase controller 310 including the self body-biasing circuit may reduce the variation of the output capacitance, thus favorably maintaining the linearity of the circuit.

Figure 17:
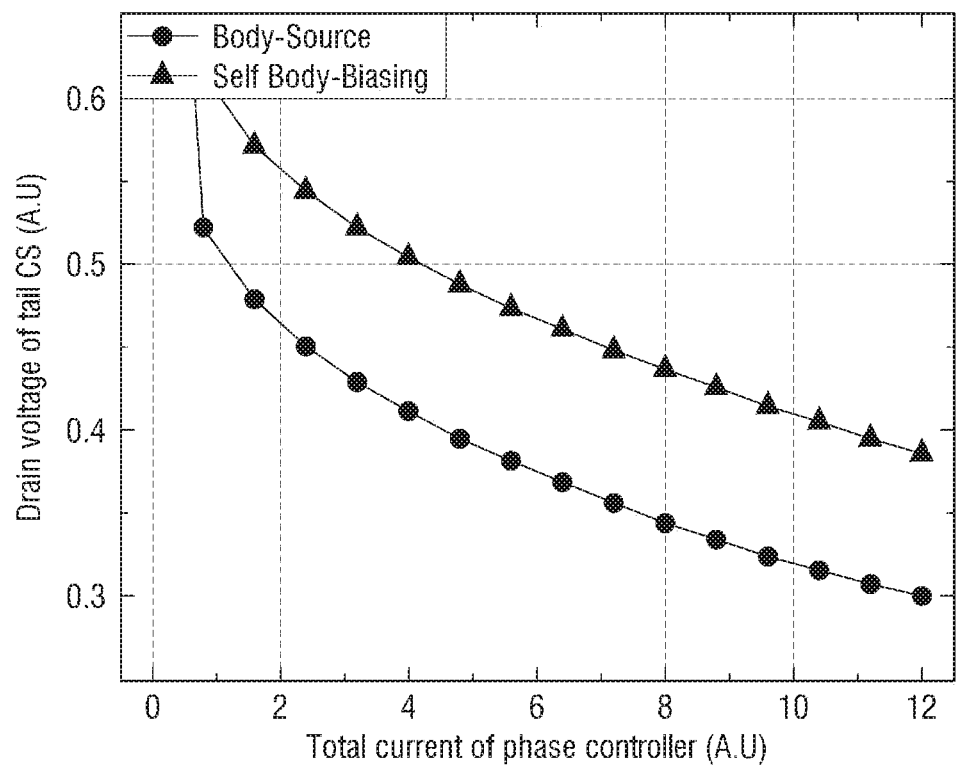
FIGS. 17 and 18 are graphs showing a drain voltage and a total current of a metal oxide semiconductor field effect transistor (MOSFET) included in a gain controller with respect to a total current of a phase controller according to some embodiments of the disclosure.
Figure 18:
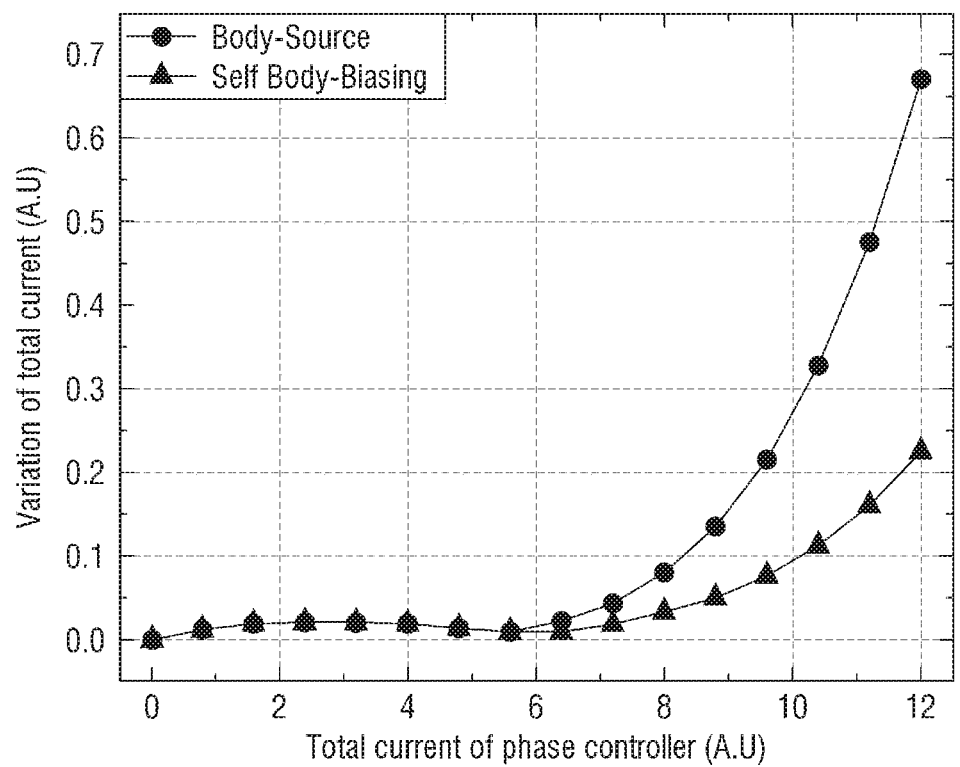

FIGS. 17 and 18 are graphs showing a variation of a drain voltage of a tail current source of the gain controllers M9, M10, M11, and M12 included in the gain controller with respect to the total current of the phase controller 310 and a variation of the total current, according to some embodiments of the disclosure.

In the graphs of FIGS. 17 and 18, the horizontal axis means the sum of the total current flowing in the phase controller 310. In the graph of FIG. 17, the vertical axis means a drain voltage of a tail current source of the gain controllers M9, M10, M11, and M12. In the graph of FIG. 18, the vertical axis means a variation of the total current flowing in the phase controller 310.

Referring to FIG. 17, it can be seen that the drain voltage of the gain controllers M9, M10, M11, and M12 controlling the tail current 1310 decreases as the total current increases. In the phase controller 310 including the self body-biasing circuit (Self-Body Biasing), a drain voltage is higher by about 0.1 than in the phase shifter configured based on the amplifier connecting the body with the source (Body-Source).

In the phase controller 310 including the self body-biasing circuit, a drain voltage of the amplifiers 1321, 1323, 1322, and 1324 is relatively high, such that as shown in FIG. 18, even when the total current increases, a large increase in the variation of the total current may be suppressed.

Referring to FIG. 18, in the phase controller 310 including the self body-biasing circuit (Self-Body Biasing), the variation of the total current increasing together with the increase in the total current is smaller than in the phase shifter configured based on the amplifier connecting the body with the source (Body-Source). Thus, it is possible to prevent the non-linearity of a circuit caused by the increase in the variation of the total current.

Figure 19:
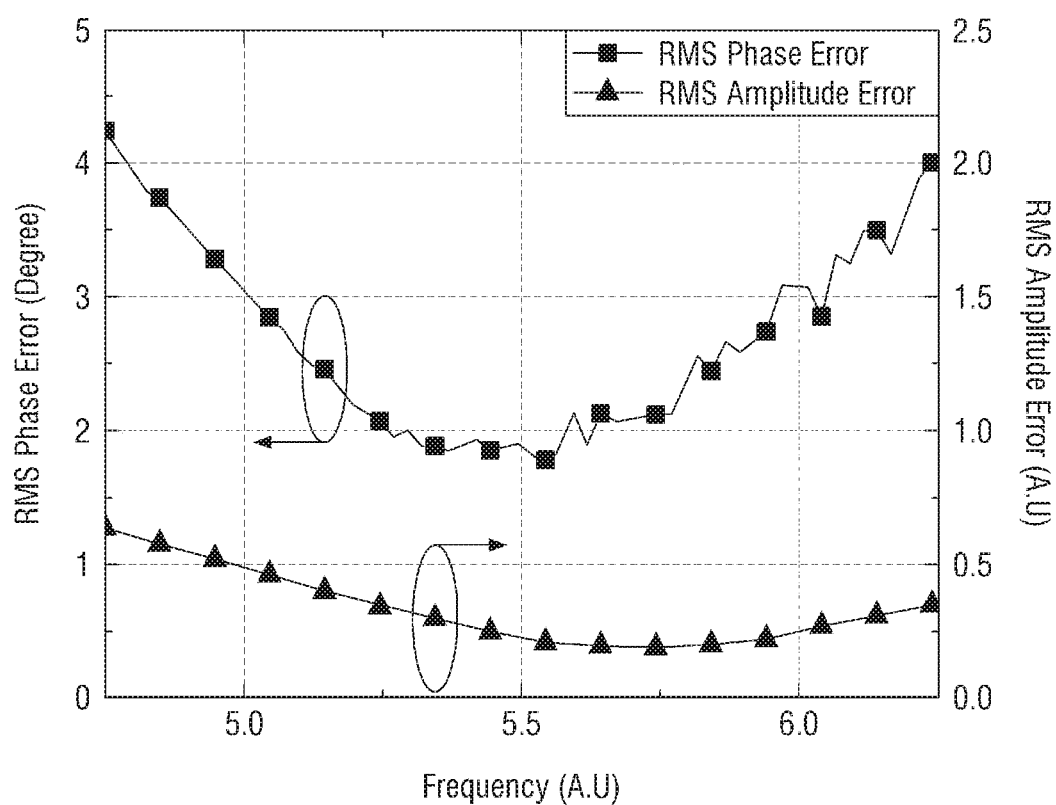
FIG. 19 is a graph showing an error result of a phase controller according to some embodiments of the disclosure.

FIG. 19 is a graph showing a root mean square (RMS) error with respect to the amplitude and the phase of a signal modulated by the phase controller 310 according to some embodiments of the disclosure. In the graph of FIG. 19, the horizontal axis means a frequency of a signal modulated by the phase controller 310. In the graph of FIG. 19, the left side of the vertical axis means a frequency-specific RMS phase error of the signal modulated by the phase controller 310. In the graph of FIG. 19, the right side of the vertical axis means a frequency-specific RMS amplitude error of the signal modulated by the phase controller 310.

Referring to FIG. 19, it can be seen that the phase controller 310 according to some embodiments has an RMS phase error of about 4 degrees or less and an RMS amplitude error of about 0.5 dB or less.

Figure 21:
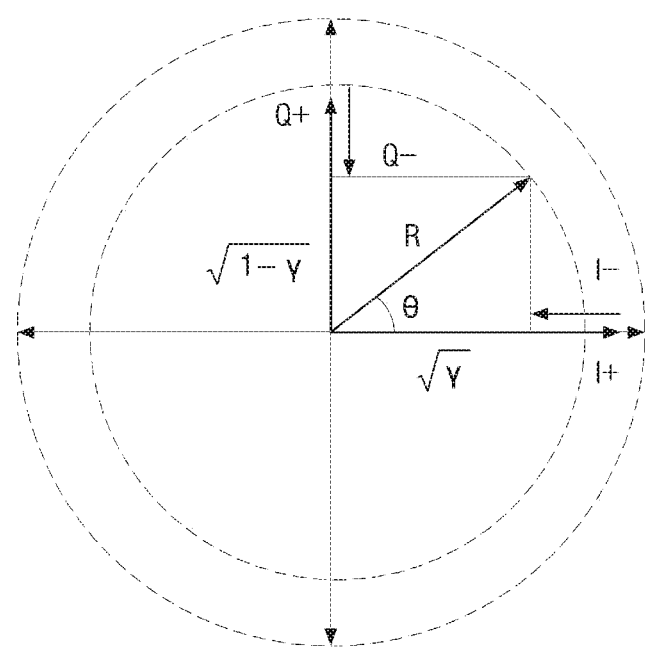

FIGS. 20 and 21 are conceptual diagrams for describing an operation of a vector sum circuit according to some embodiments. For the convenience of a description, a self body-biasing circuit is omitted in FIG. 20.

Referring to FIG. 20, the gate of the gain controller M9 is connected to the node I_DAC of the current mirror circuit 1400 and the gate of the gain controller M11 is connected to the node Q_DAC node of the current mirror circuit 1400, such that the amplifiers 1321 and 1323 are enabled. On the other hand, referring to FIG. 20, the gates of the gain controllers M10 and M12 are connected to the ground node such that the gain controllers M10 and M12 and the amplifiers 1322 and 1324 are disabled. Thus, the first current of the current mirror circuit 1400 may be induced at the tail of the first amplifier 1321, and the second current of the current mirror circuit 1400 may be induced at the tail of the second amplifier 1323. As a result, the first amplifier 1321 may amplify the I signal of the orthogonal signal 425 according to a gain corresponding to the first current, and the second amplifier 1323 may amplify the Q signal of the orthogonal signal 425 according to a gain corresponding to the second current. In particular, FIG. 20 shows an operating state of an orthogonal signal amplifier 430a when a phase difference to be controlled belongs to any one of the quadrants, and for another quadrant to which the phase difference to be controlled belongs, an amplifier to be enabled may be changed.

Referring to FIG. 21, when a gain factor of the I signal is $\alpha$ and the gain factor of the Q signal is $\beta$, the phase controller 310, according to some embodiments, may control the magnitudes of the I+ signal, the Q+ signal, the I- signal, and the Q- signal.

$$I+:I-=\sqrt{\alpha}:\sqrt{1-\alpha}\,(0\leq\alpha\leq1)$$

$$Q+:Q-=\sqrt{\beta}:\sqrt{1-\beta}\,(0\leq\beta\leq1) \qquad \text{Equation 1}$$

Herein, by using Equation (2), the phase controller 310, according to some embodiments, may determine an amplitude R and a phase $\theta$ of a signal including a combination of the I+ signal, the Q+ signal, the I- signal, and the Q- signal, the magnitudes of which are controlled based on the gain factors, as shown in FIG. 20.

$$R = k \cdot \sqrt{\alpha(1-\alpha)} = k \cdot \sqrt{\beta(1-\beta)} \qquad \text{Equation 2}$$

$$\theta = \tan^{-1}\frac{\sqrt{1-\gamma}}{\sqrt{\gamma}}$$

Herein, K is a constant.

For $\alpha=\beta$ and $\alpha>0.5$, a combined signal is located in a first quadrant. For $\alpha=1-\beta$ and $\alpha<0.5$, the combined signal is located in a second quadrant. For $\alpha=\beta$ and $\alpha<0.5$, the combined signal is located in a third quadrant. For $\alpha=1-\beta$ and $\alpha>0.5$, the combined signal is located in a fourth quadrant. Herein, the gain factor may be included in a control value indicating the phase difference to be controlled. The orthogonal signal amplifier 430a may select the amplifiers 1321, 1323, 1322, and 1324 to be enabled according to the gain factor.

Figure 22:
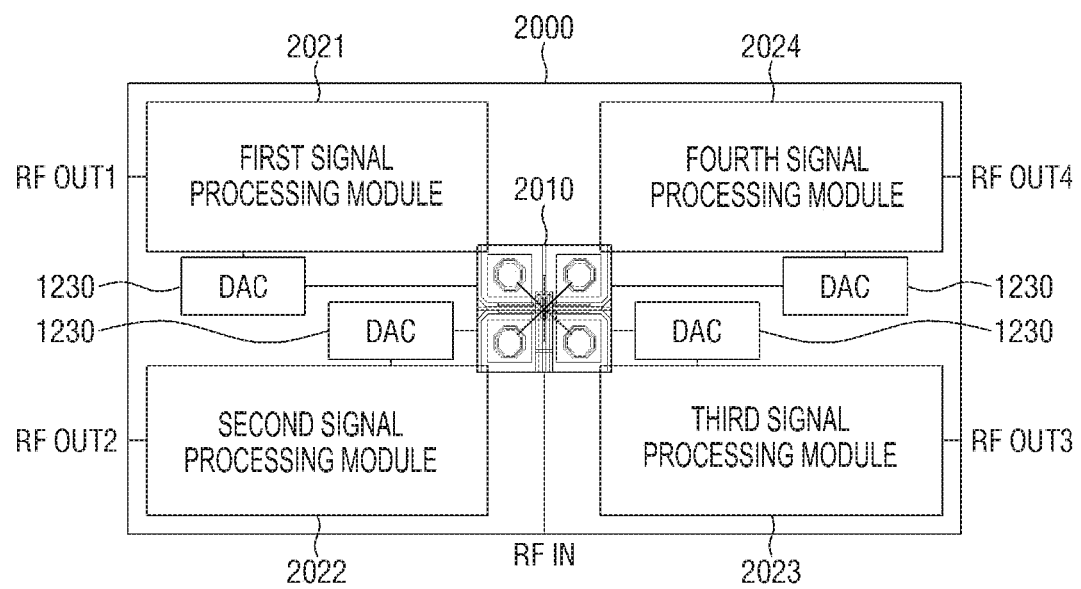
FIG. 22 is a diagram for describing a structure of a semiconductor chip according to some embodiments of the disclosure.

FIG. 22 is a diagram for describing a structure of a semiconductor chip 2000 according to some embodiments of the disclosure. For a phase shifter using a delay line, the size of the phase shifter may increase to improve the resolution of the phase shifter, making it difficult to implement a multi-channel phase shifter in one semiconductor chip. However, with the phase controller 310 according to an embodiment of the disclosure, the multi-channel phase controller 310 may be implemented in one semiconductor chip 2000 because the phase controller 310 may be implemented in a small size thereof while improving the resolution.

FIG. 22 is a diagram for describing a structure of a semiconductor chip 2000 according to some embodiments. The semiconductor chip 2000, according to some embodiments, may include the DAC 1230, a first signal processing module 2021, a second signal processing module 2022, a third signal processing module 2023, and a fourth signal processing module 2024 that each output an output signal having phase modulated for each channel, and a power distributor 2010 that distributes power to each of the first through fourth signal processing modules 2021, 2022, 2023, and 2024. Each of the first through fourth signal processing modules 2021, 2022, 2023, and 2024 may include the phase controller 310.

Herein, the DAC 1230 may convert a digital signal for controlling the phase controller 310 into an analog signal. Each of the first through fourth signal processing modules 2021, 2022, 2023, and 2024 may include the phase controller 310 controlled by the DAC 1230. The semiconductor chip 2000, according to some embodiments, may include four DACs 1230 for controlling the first through fourth signal processing modules 2021, 2022, 2023, and 2024, respectively.

When the first through fourth signal processing modules 2021, 2022, 2023, and 2024 are configured using the phase controller 310 according to the above-described embodiment, the size of a signal processing module may be reduced while improving a resolution of phase control, such that the first through fourth signal processing modules 2021, 2022, 2023, and 2024 capable of processing a 4-channel beamforming signal may be mounted in one semiconductor chip. For example, a circuit having the structure shown in FIG. 22 may be mounted in a single chip having a size of 2562×1324 um2.

Once signals output from the first through fourth signal processing modules 2021, 2022, 2023, and 2024, which form respective channels, are emitted to the outside, the output signals may form a beam for transmitting power distributed by the power distributor 2010.

Figure 23:
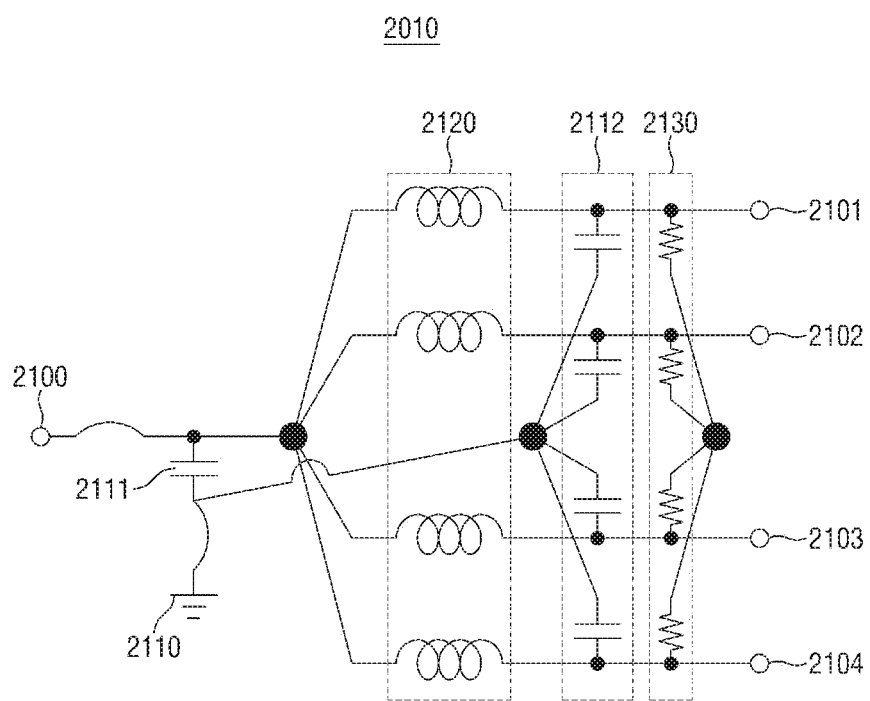
FIG. 23 is a diagram showing a structure of a power distributor according to some embodiments of the disclosure.

To construct the semiconductor chip as shown in FIG. 22, the power distributor 2010 for distributing power to the phase controller 310 of each of the first through fourth signal processing modules 2021, 2022, 2023, and 2024 is needed. FIG. 23 is a diagram showing a structure of a power distributor 2010 according to some embodiments.

The power distributor 2010 may be configured to distribute power input to an input node 2100 to distribution nodes 2101, 2102, 2103, and 2104 connected to the first through fourth signal processing modules 2021, 2022, 2023, and 2024 or the phase controller 310.

FIG. 23 is a diagram showing a structure of a power distributor according to some embodiments of the disclosure.

Referring to FIG. 23, according to some embodiments, the power distributor 2010 may connect a ground part 2110 to the input node 2100 and the distribution nodes 2101, 2102, 2103, and 2104 such that the first through fourth signal processing modules 2021, 2022, 2023, and 2024 forming four channels have the same grounding effect.

For the same grounding effect of the first through fourth signal processing modules 2021, 2022, 2023, and 2024, the power distributor 2010 may include a capacitor 2111 connected between the ground part 2110 and the input node 2100 and capacitors 2112 connected between the ground part 2110 and the distribution nodes 2101, 2102, 2103, and 2104. The power distributor 2010 may further include inductors 2120 connected between the input node 2100 and the distribution nodes 2101, 2102, 2103, and 2104. The power distributor 2010 may further include resistors 2130, one side of which are connected to one another and other sides of which are connected to the distribution nodes 2101, 2102, 2103, and 2104.

Power may be distributed to several-channel signal processing modules by using the power distributor according to the current embodiment, and the signal processing modules 2021, 2022, 2023, and 2024 of respective channels have the same grounding effect, thereby providing a semiconductor chip capable of performing stable signal processing.

Once the multi-channel beamforming hardware platform 300 is configured using the semiconductor chip according to some embodiments, the phase of an input signal may be modulated using the orthogonal signal amplifier 430 configured as a single block, thus preventing a phase error from occurring due to amplitude modulation or an amplitude error from occurring due to phase modulation.

While the disclosure has been shown and described with reference to various embodiments thereof, it will be understood by those of ordinary skill in the art that various changes in form and details may be made therein without departing from the spirit and scope of the disclosure as defined by the appended claims and their equivalents. Accordingly, the aforementioned embodiments should be construed as being only illustrative, but should not be constructed as being restrictive from all aspects.

What is claimed is:

1. A vector sum circuit comprising:
an amplifier configured to amplify an orthogonal signal by using a first metal oxide semiconductor field effect transistor (MOSFET);
a self body-biasing circuit comprising a resistor
configured to connect a drain and a body of the first MOSFET to reduce a voltage applied to the body as a current at the drain increases; and
an amplification controller configured to control a tail current of the amplifier,
wherein the amplifier controller comprises a second MOSFET and a switch, and
wherein the switch is configured to provide an output of a current mirror circuit interlocked with an output of a digital-to-analog converter (DAC) to a gate of the second MOSFET.

2. The vector sum circuit of claim 1,
wherein the amplification controller is further configured to
determine whether to enable the amplifier based on a phase difference to be controlled for the orthogonal signal.

3. The vector sum circuit of claim 2, wherein the
second MOSFET is connected to a source of the first MOSFET and configured to control the tail current of the amplifier.

4. The vector sum circuit of claim 3,
wherein the first MOSFET is configured to receive the orthogonal signal through a gate thereof, and
wherein a drain of the second MOSFET is connected to the source of the first MOSFET.

5. The vector sum circuit of claim 2,
wherein the amplifier comprises:
a first amplifier; and
a second amplifier, and
wherein the amplification controller is further configured to control rates of a first tail current of the first amplifier and a second tail current of the second amplifier while maintaining a sum of the first tail current and the second tail current constant.

6. The vector sum circuit of claim 1,
wherein the orthogonal signal comprises an I+ signal, a Q+ signal, an I− signal, and a Q− signal,
wherein the amplifier comprises:
a first amplifier and a third amplifier into which the I+ signal and the I− signal are input, respectively, and
a second amplifier and a fourth amplifier into which the Q+ signal and the Q− signal are input, respectively,
wherein outputs of the first amplifier and the third amplifier are connected inversely with respect to each other, and
wherein outputs of the second amplifier and the fourth amplifier are connected inversely with respect to each other.

7. The vector sum circuit of claim 6,
wherein the first amplifier and the third amplifier comprise the first MOSFET into which the I+ signal is input and a third MOSFET into which the I− signal is input, respectively,
wherein the second amplifier and the fourth amplifier comprise a fourth MOSFET into which the Q+ signal is input and a fifth MOSFET into which the Q− signal is input, respectively,
wherein the first MOSFET and the third MOSFET are connected with a second MOSFET connected to a first output node of the current mirror circuit, and
wherein the fourth MOSFET and the fifth MOSFET are connected to a sixth MOSFET connected to a second output node of the current mirror circuit.

* * * * *